(12) United States Patent
Prokin et al.

(10) Patent No.: US 6,985,034 B1
(45) Date of Patent: Jan. 10, 2006

(54) BOOST BRIDGE AMPLIFIER

(76) Inventors: Milan Prokin, Dr Agostina Neta 76/64, YU-11070 Novi Beograd (YU); Milenko Cvetinovic, Save Kovacevica 36A, YU-11000 Beograd (YU)

(*) Notice: Subject to any disclaimer, the term of this patent is extended or adjusted under 35 U.S.C. 154(b) by 213 days.

(21) Appl. No.: 10/019,888

(22) PCT Filed: Jun. 7, 2000

(86) PCT No.: PCT/YU00/00014

§ 371 (c)(1),
(2), (4) Date: Apr. 18, 2002

(87) PCT Pub. No.: WO01/01554

PCT Pub. Date: Jan. 4, 2001

(30) Foreign Application Priority Data

Jun. 29, 1999 (YU) .................................. 308/99

(51) Int. Cl.
*H03F 3/217* (2006.01)
(52) U.S. Cl. .................................. 330/251; 330/207 A
(58) Field of Classification Search .................. 330/10, 330/146, 207 A, 251; 381/120
See application file for complete search history.

(56) References Cited

U.S. PATENT DOCUMENTS

| 4,511,823 A | | 4/1985 | Eaton et al. ................ 315/226 |
|---|---|---|---|
| 4,864,479 A | * | 9/1989 | Steigerwald et al. ........... 363/17 |
| 5,229,930 A | | 7/1993 | Makimaa ..................... 363/132 |
| 5,442,317 A | * | 8/1995 | Stengel ........................ 330/146 |
| 5,612,646 A | * | 3/1997 | Berning ....................... 330/297 |
| 5,680,301 A | | 10/1997 | Oughton, Jr. et al. ......... 363/132 |
| 5,771,159 A | * | 6/1998 | Sako et al. .................... 363/17 |
| 5,838,558 A | * | 11/1998 | Tan et al. ..................... 363/91 |
| 5,875,107 A | * | 2/1999 | Nagai et al. ................. 363/131 |
| 6,016,258 A | * | 1/2000 | Jain et al. ..................... 363/17 |
| 6,051,936 A | * | 4/2000 | Qian ........................... 315/224 |
| 6,075,715 A | * | 6/2000 | Maehara et al. .............. 363/37 |

OTHER PUBLICATIONS

"Boost Bridge Audio Amplifier," Milan Prokin, IEEE Transactions on Consumer Electronics, vol. 47, No. 2, May 2001, pp. 214-224.
"Boost Bridge Amplifier," Milan Prokin, Electronic Letters, vol. 37, No. 10, May 10, 2001, pp. 609-610.

* cited by examiner

*Primary Examiner*—Khanh V. Nguyen
(74) *Attorney, Agent, or Firm*—William A. Simons; Wiggin and Dana LLP

(57) ABSTRACT

The main difference between the boost bridge amplifier according to this invention and state of the art class D amplifiers is in the connection of a load between a power supply and a switching bridge which is supplied from a bridge capacitor. The switching bridge operation is controlled by the pulse-width modulated control signals. Thereby, it is possible to completely eliminate both input and output filters, which are required in state of the art class D amplifiers. It is also possible to achieve several times higher power at the load, due to the additional switching bridge supply from the bridge capacitor. Conducted and radiated EMI noise is significantly reduced in comparison with state of the art class D amplifiers. This embodiment provides a low price, small size and low EMI noise level.

81 Claims, 13 Drawing Sheets

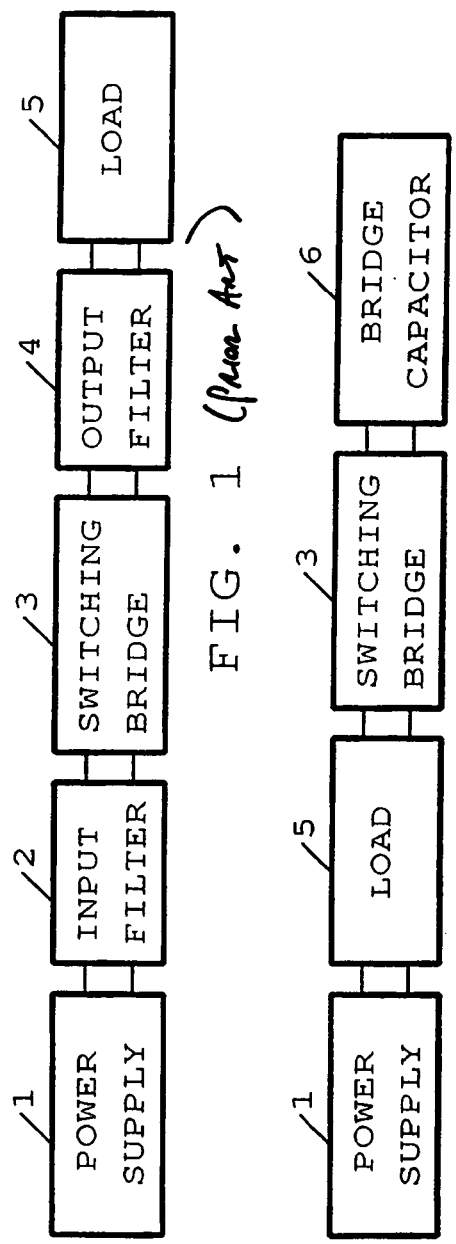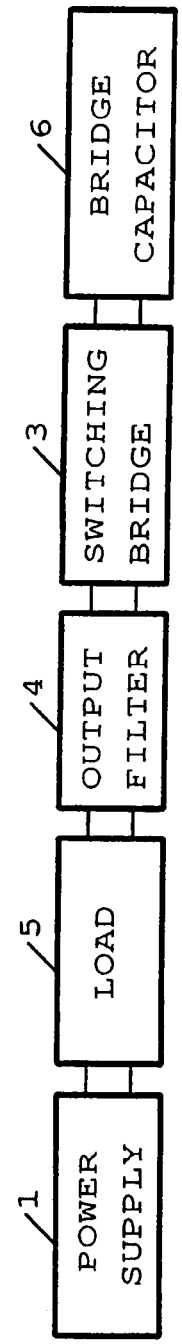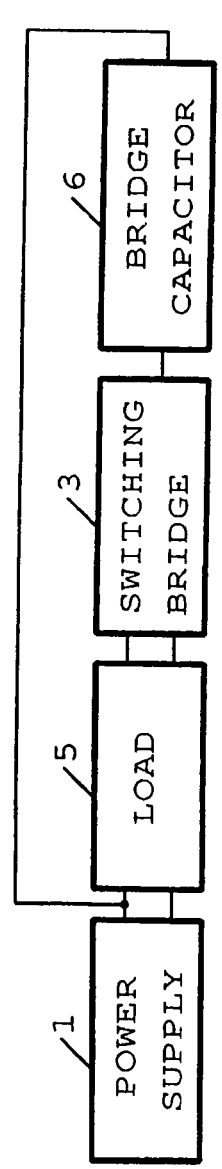

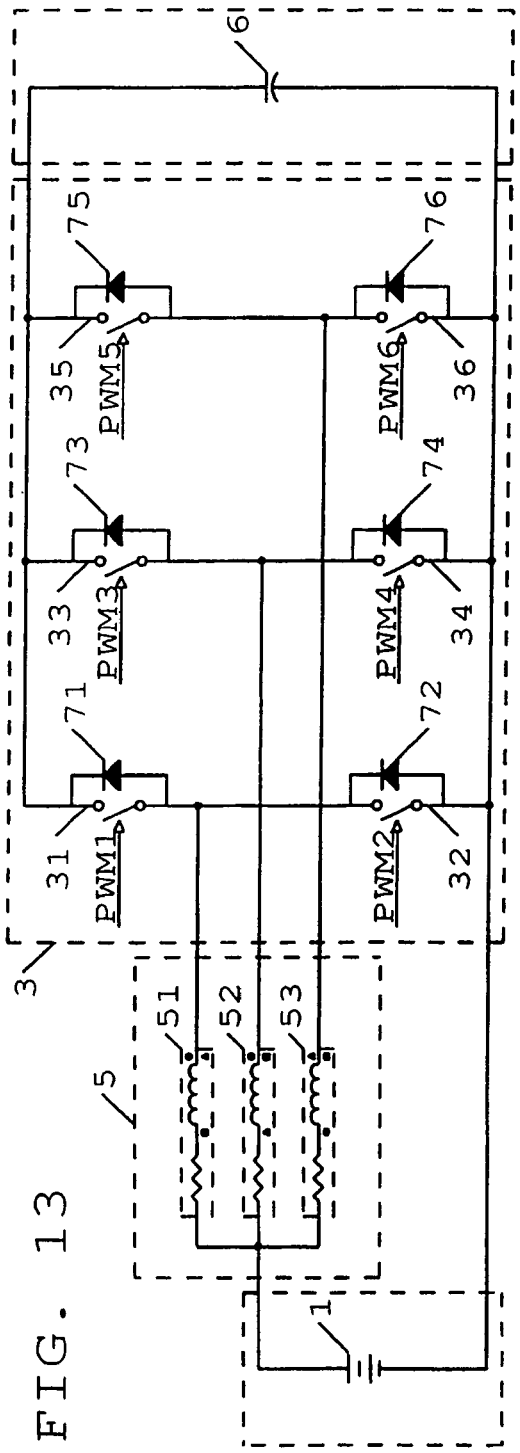
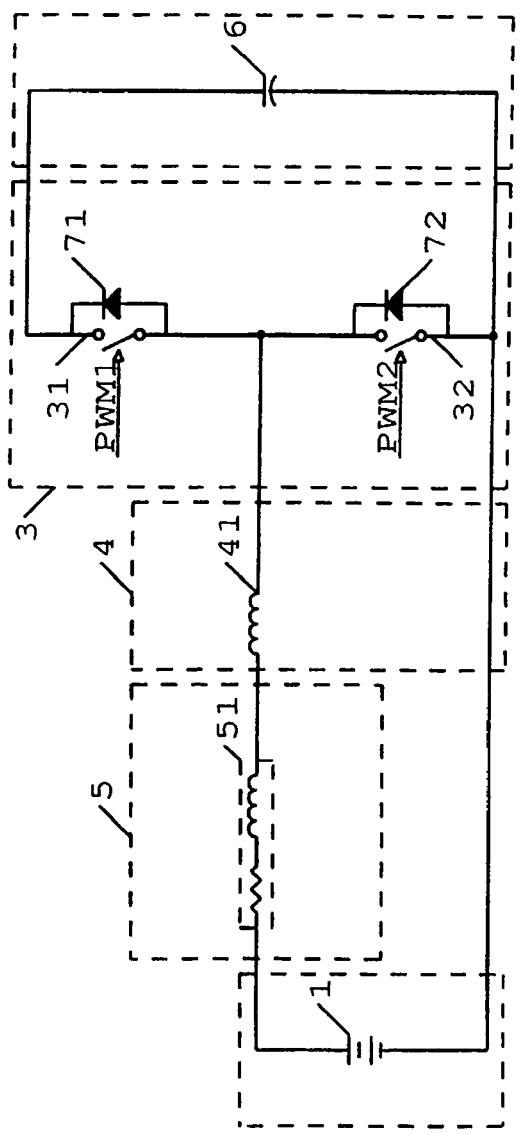
FIG. 13
FIG. 14

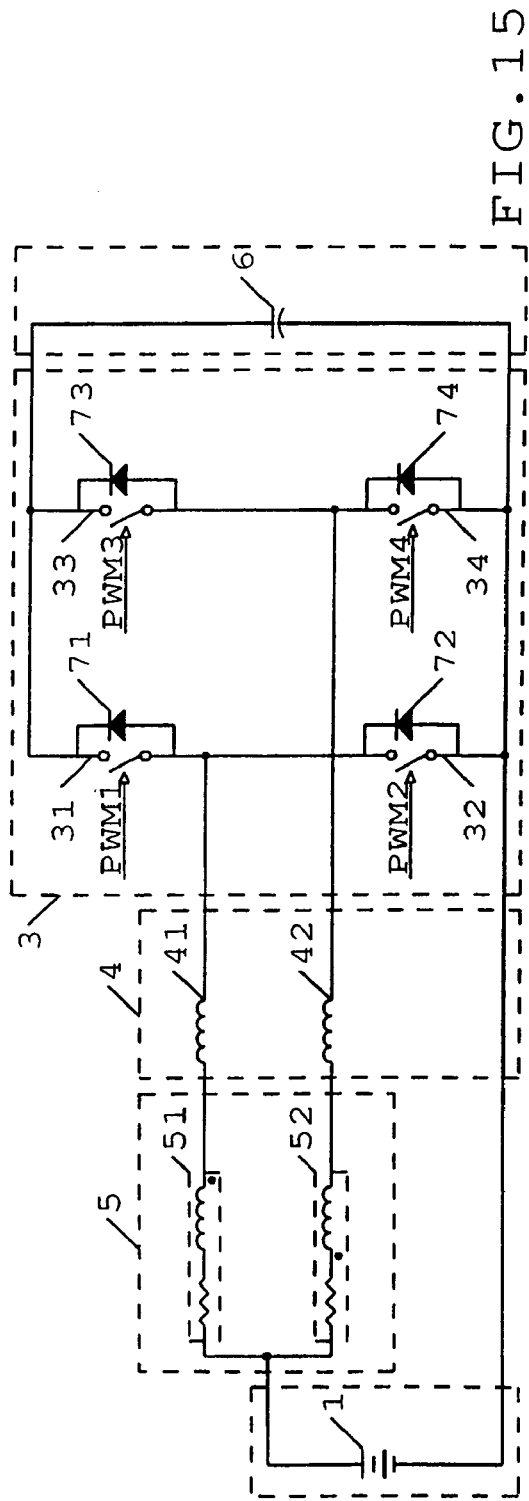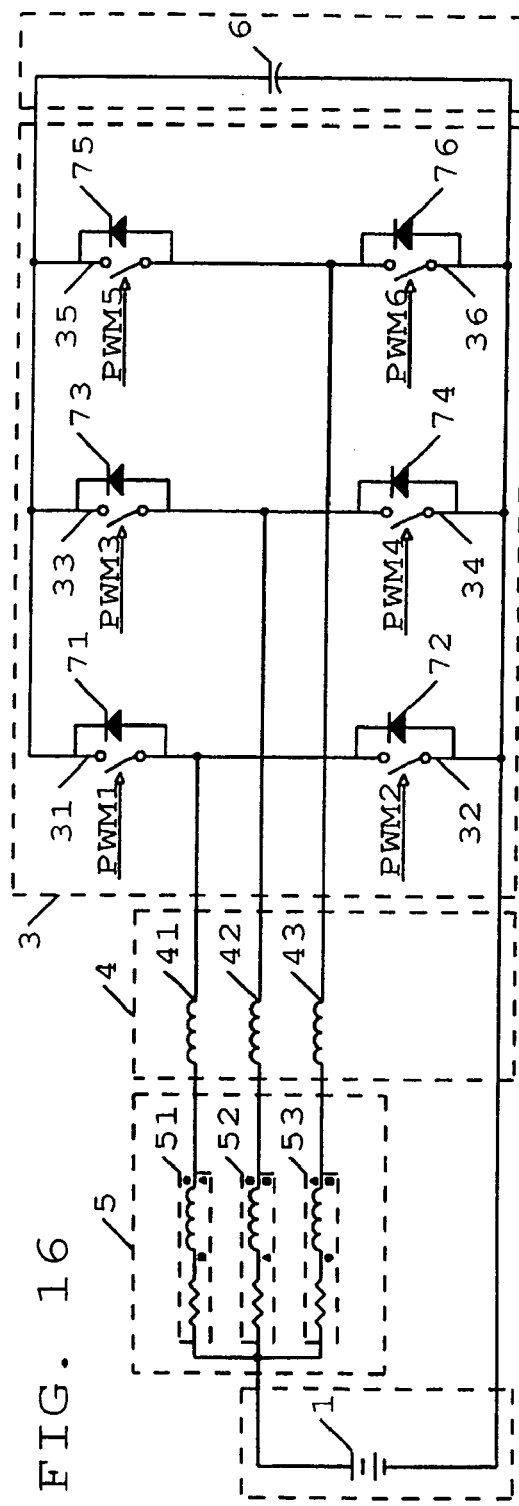

BOOST BRIDGE AMPLIFIER

TECHNICAL FIELD

This invention generally relates to amplifiers, and more particularly to audio amplifiers and inverters for driving electric motors.

This invention overcomes the problem of amplifying signals having varying frequency in a wide range, theoretically from zero frequency to some predefined frequency, by the use of a small number of electronic components, so to provide: maximum load power, several times higher than the power which can be achieved from the same power supply by the use of the existing amplifiers of all classes without boost converter as a power supply; minimum distortion; maximum efficiency; elimination of radiated and conducted noise; maximum power supply noise rejection; efficient protection from overvoltage emerging from power supply; and minimal size of the amplifier. This technical problem is solved by a new boost bridge amplifier, hereafter BB amplifier, according to the following specification.

BACKGROUND ART

Prior art discloses only amplifiers with a load at their output (FIG. 1), but does not disclose amplifiers with a load at their input (FIGS. 2, 3 and 4) directly connected to the power supply.

Different embodiments of switching class-D amplifiers for a mono-phase load (for instance, single voice coil loudspeaker) are disclosed in the following U.S. Pat. Nos.: 3,585,517 issued June 1971. to R. B. Herbert (FIG. 6); U.S. Pat. No. 4,649,565 issued March, 1987. to A. J. M. Kaizer et al. (FIG. 5); and Re. 33,333 issued Sep. 11, 1990. to W. E. Taylor, Jr. et al.

Class D amplifier for a two-phase load (for instance, a loudspeaker with two grounded voice coils) is disclosed in U.S. Pat. No. 4,360,707, issued November 1982. to J. R. Joseph et al.

Output LC filter of a class D amplifier, used for reconstruction of the amplified signal at the output of the switching bridge, requires a large number of components of significant size, whereby the price and the dimensions of class D amplifier are considerably increased.

If the amplifier load is other than nominal for output LC filter, the amplitude response will significantly depart from the designed one. In case of a load value less than nominal, the amplitude response will be less than that designed. In case of a load value greater than nominal, amplitude response will be greater than that designed. In case of a unloaded amplifier operating in the vicinity of parallel resonance frequency of the output LC filter, extremely high voltage is generated, which could lead to a filter capacitors breakthrough.

However, the majority of loads used nowadays, such as electrodynamic loudspeakers, induction electric motors and brushless DC motors, are characterized by a significant inductance of their windings in relation to resistance, so that they are completely unfit for direct connection to output LC filters which are designed for a purely resistive load. One skilled in the art solves this problem by the use of a Sobel filter connected in parallel to the inductive load, whereby the total impedance becomes purely resistive at all frequencies of interest. Sobel filter consists of a resistor of the same value as the load resistance, serially connected to a specially selected capacitor canceling the effect of the load inductance. However, this solution considerably increases dissipation of the switching bridge because additional low impedance is connected in parallel to the amplifier output.

Output LC filters of audio amplifiers and fast reacting electric motor drives feature relatively low impedance of filtering inductances, leading to an increase in current ripple through all transistors in the switching bridge, and thereby to increased dissipation on them and resistances of filter inductances.

Input LC filter of a class D amplifier, which is used to reduce injection of conducted EMI noise from the switching bridge into the cable connecting the power supply, requires bulky components, whereby the price and the dimensions of class D amplifiers are increased.

The design of such input LC filter requires special attention due to mutual interaction between its output impedance and the input impedance of the switching bridge, in order to avoid voltage oscillations at the switching bridge.

A special problem appearing during the operation of class D amplifiers with both positive and negative power supplies is power supply bus "runaway" during the amplification of low frequency signals. During the positive half cycle of an input signal, the observed switch is on most of the time and power is delivered to the load and partly accumulated in the filter inductor. During the negative half cycle, the observed switch is off most of the time, and the current of the filter inductor returns back to the power supply through the diode antiparallel to the observed switch. In that case, during the positive half cycle the positive power supply voltage is decreased, while during the negative half cycle it is increased. Bearing in mind that most power supplies are made to source, and not to sink the current, the voltage increase requires utilization of bulky capacitors or special protection circuits in the power supply.

More detailed discussion of the problems associated with state of the art class D amplifiers is given in application notes: AN1042 "High Fidelity Switching Audio Amplifiers Using TMOS Power MOSFETs" issued by Motorola Semiconductor in 1989., AN1013 "Mono Class-D Amplifiers" issued by SGS-Thomson Microelectronics in 1998., AN9525 "Class-D Audio II Evaluation Board" issued by Harris Semiconductor in 1996., SLOU032A "TPA005D02 Class D Stereo Audio Power Amplifier Evaluation Module User's Guide" and "A Real Analysis of the Power Behind Audio Power Amplifier Systems" both issued by Texas Instruments in 1998.

A standard high-power amplifier consisting of a switching power supply for voltage increase (boost converter) (FIG. 8) connected to a class D amplifier (FIG. 9), as well as its modified version, i.e. a switching amplifier made of two switching power supplies for the voltage increase and a mono-phase load at its output (FIG. 10), are disclosed in U.S. Pat. No. 4,186,437 issued January, 1980. to S. M. Cuk, and scientific paper: R. O. Caceres and I. Barbi, "A Boost DC-AC Converter: Analysis, Design, and Experimentation", IEEE Transactions on Power Electronics, Vol. 14, No. 1, pp. 134–141, January 1999. While standard version is utilized in audio amplifiers, its modified version requires very small inductors and capacitors for the reproduction of audio frequencies, leading to increased current ripple through all switches and increased output voltage ripple, significantly reducing amplifier efficiency. Feedback is also complex and requires current sensing through inductors and voltage sensing at output capacitors. In case of any instability in the feedback loop, the output voltage is unlimited and could provoke switches breakthrough.

Linear push-pull amplifiers for a two-phase load (for example, a loudspeaker with two grounded voice coils) are disclosed in the following U.S. Pat. Nos.: 4,130,725, issued December 1978. to M. J. Nagel, U.S. Pat. No. 4,201,886, issued May 1980. to M. J. Nagel, and U.S. Pat. No. 4,220,832, issued September 1980. to M. J. Nagel.

Linear class AB amplifiers for a two-phase load (for example, a loudspeaker with two grounded voice coils) with variable voltage power supply are disclosed in U.S. Pat. No. 5,748,753, issued May 1998. to R. W. Carver.

The basic problem in all existing linear audio amplifiers in classes A, B and AB is the generation of heat and low efficiency during normal operation, requiring high power consumption from the power supply, which is of specific interest for battery supplied devices such as those in cars, portable computers, radios, cassette and CD players.

The problems of conducted and radiated EMI noise generation in spite of input and output LC filters utilization in switching amplifiers (inverters) for a three-phase load (for example, induction electric motor or brushless DC motor) are disclosed in U.S. Pat. No. 5,661,390 issued August, 1997. to T. A. Lipo et al. (FIG. 7), as well as in scientific paper D. A. Rendusara and P. N. Enjeti, "An Improved Inverter Output Filter Configuration Reduces Common and Differential Modes dv/dt at the Motor Terminals in PWM Drive Systems", IEEE Transactions on Power Electronics, Vol. 13, No. 6, pp. 1135–1143, November 1998.

DISCLOSURE OF THE INVENTION

The first object of the present invention is to provide a new boost bridge amplifier in which mono- or poly-phase load is directly connected to the power supply, on one side, and appropriate switching bridge, on the other side, and this to the bridge capacitor.

The second object of the present invention is to provide the same amplifier as the first, with the addition of an output filter between mono- or poly-phase load and the appropriate switching bridge.

The third object of the present invention is to provide the boost bridge amplifier, in which mono- or poly-phase load is still directly connected to the power supply, on one side, and the appropriate switching bridge, on the other side, while the bridge capacitor is connected between the appropriate switching bridge node and the load node, which is connected to the power supply.

BRIEF DESCRIPTION OF DRAWINGS

The advantages and features of the present invention will be readily apparent to those skilled in the art from the detailed description of the preferred embodiments of the present invention in connection with the accompanying drawings in which:

FIG. 1 is a block diagram of state of the art class D amplifier.

FIG. 2 is a block diagram of the invented boost bridge amplifier (further BB amplifier) with the bridge capacitor connected to switching bridge ends.

FIG. 3 is a block diagram of the invented BB amplifier with the bridge capacitor connected to switching bridge ends, and input and output filters.

FIG. 4 is a block diagram of the invented BB amplifier with the bridge capacitor connected between the switching bridge and the power supply.

FIG. 13 is a schematic diagram of the invented BB amplifier with the bridge capacitor connected to the switching bridge ends and a three-phase load, appropriate to the block diagram of FIG. 2.

FIG. 14 is a schematic diagram of the invented BB amplifier with the bridge capacitor connected to the switching bridge ends, output L filter and a mono-phase load, appropriate to the block diagram of FIG. 3.

FIG. 15 is a schematic diagram of the invented BB amplifier with the bridge capacitor connected to the switching bridge ends, output L filter and a two-phase load, appropriate to the block diagram of FIG. 3.

FIG. 16 is a schematic diagram of the invented BB amplifier with the bridge capacitor connected to the switching bridge ends, output L filter and a three-phase load, appropriate to the block diagram of FIG. 3.

BEST MODE(S) FOR CARRYING OUT THE INVENTION

Figure 5:
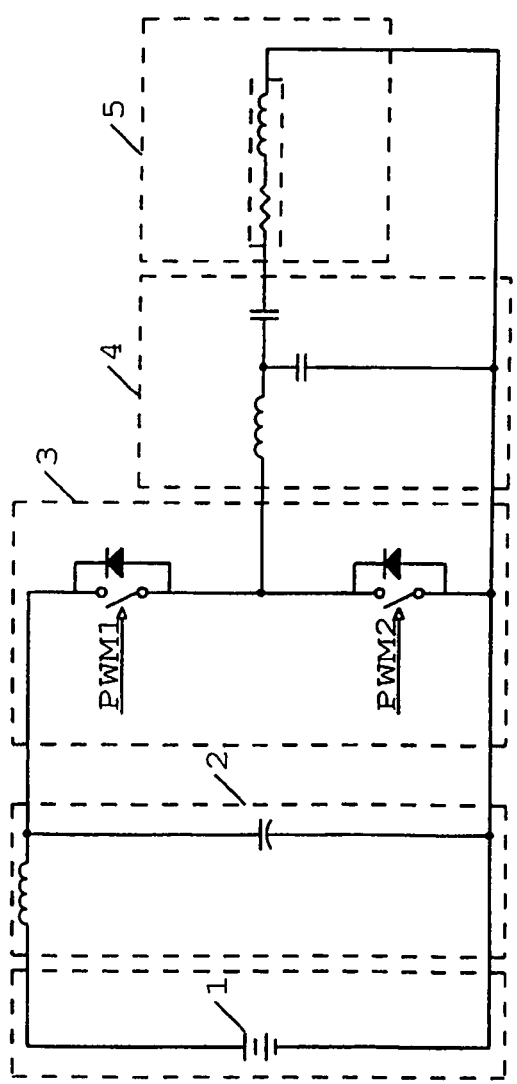
FIG. 5 is a schematic diagram of state of the art class D amplifier with input and output filters and a mono-phase load at its output.

FIG. 1 is a block diagram of state of the art class D amplifier. The power supply 1 is connected to input filter 2 input. The input filter 2 output is connected to switching bridge 3 input. The switching bridge 3 operation is controlled by the pulse-width modulated control signals PWM. The switching bridge 3 output is connected to output filter 4 input. The output filter 4 output is connected to the load 5.

FIG. 2 is a block diagram of the invented boost bridge amplifier (BB amplifier). The power supply 1 is connected to load 5 input. The load 5 output is connected to switching bridge 3 input The switching bridge 3 operation is controlled by the pulse-width modulated control signals PWM. The switching bridge 3 output is connected to the bridge capacitor 6. This embodiment completely eliminates both the input filter 2 and the output filter 4, while directly connecting the load 5 to the power supply 1, and enables several times greater power at the load 5 with the help of an additional supply at the switching bridge 3 from the bridge capacitor 6. Conducted and radiated EMI noise is significantly reduced in comparison with a class D amplifier. This embodiment enables low price, minimal size and low level of EMI noise.

FIG. 3 is a block diagram of the invented BB amplifier. The power supply 1 is connected to load 5 input. The load 5 output is connected to output filter 4 input. The output filter 4 output is connected to switching bridge 3 input. The switching bridge 3 operation is controlled by the pulse-width modulated control signals PWM. The switching bridge 3 output is connected to the bridge capacitor 6. This embodiment completely eliminates the input filter 2 and significantly reduces the output filter 4, while directly connecting the load 5 to the power supply 1, and enables several times greater power at the load 5 with the help of an additional supply at the switching bridge 3 from the bridge capacitor 6. This embodiment is used to further decrease conducted and radiated EMI noise to a negligible level in comparison with a class D amplifier. This embodiment enables an extremely low level of EMI noise, together with slightly higher price and size of the amplifier.

FIG. 4 is a block diagram of the invented BB amplifier. The power supply 1 is connected to load 5 input. The load 5 output is connected to the switching bridge 3 input. The switching bridge 3 operation is controlled by the pulse-width modulated control signals PWM. The switching bridge 3 output is connected to the bridge capacitor 6. The bridge capacitor 6 is also connected to the power supply 1. This embodiment completely eliminates both the input filter 2 and the output filter 4, while directly connecting the load 5 to the power supply 1, and enables several times greater power at the load 5 with the help of an additional supply at the switching bridge 3 from the bridge capacitor 6. Conducted and radiated EMI noises are slightly reduced in comparison with a class D amplifier. This embodiment enables extremely low price and extremely small size of the amplifier, together with slightly increased EMI noise in comparison with the embodiment from FIG. 2.

Figure 6:
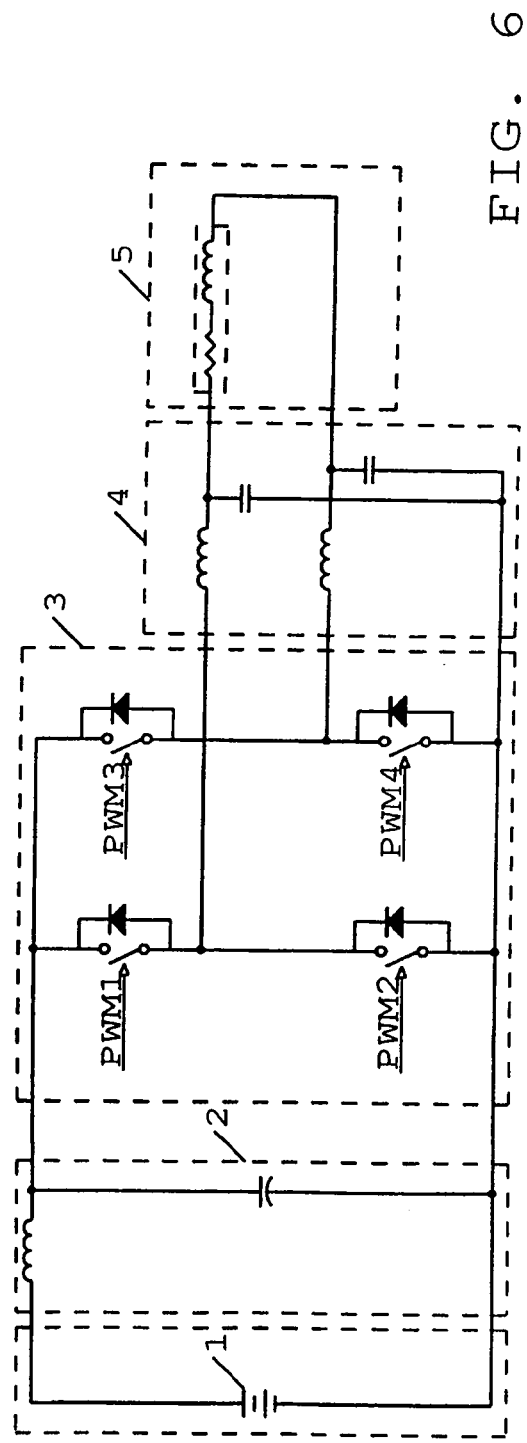
FIG. 6 is a schematic diagram of state of the art class D amplifier with input and output filters and a two-phase load at its output
Figure 7:
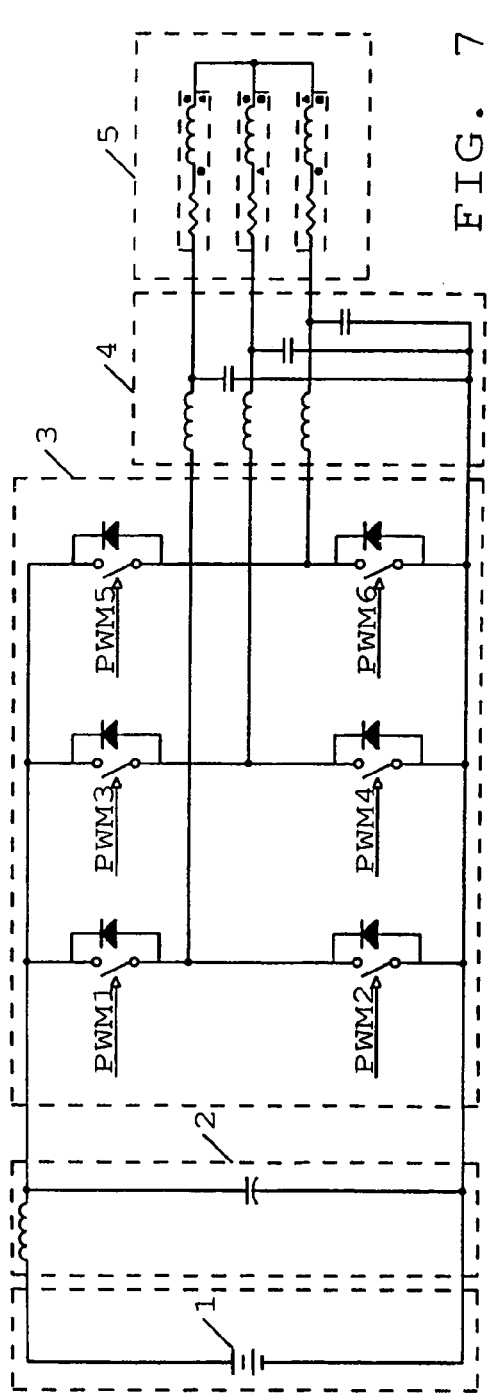
FIG. 7 is a schematic diagram of state of the art class D amplifier with input and output filters and a three-phase load at its output.

FIGS. 5, 6 and 7 are schematic diagrams of state of the art class D amplifiers with input and output filters and mono-phase, two-phase and three-phase loads at their output, respectively. Power supply 1 disturbances are filtered in an input filter 2. The switching bridge 3 draws pulsed current from the input filter 2, generating accordingly high level of conducted and radiated EMI noise, especially in case of long cables between the power supply 1 and the input filter 2. The output filter 4, intended for filtering noise and decreasing voltage ripple at the load 5, is connected between the switching bridge 3 and the load 5. In case of short cables between the switching bridge 3 and the load 5, in some cases it is possible to eliminate the output filter 4, however significantly increasing conducted and radiated EMI noise.

Figure 8:
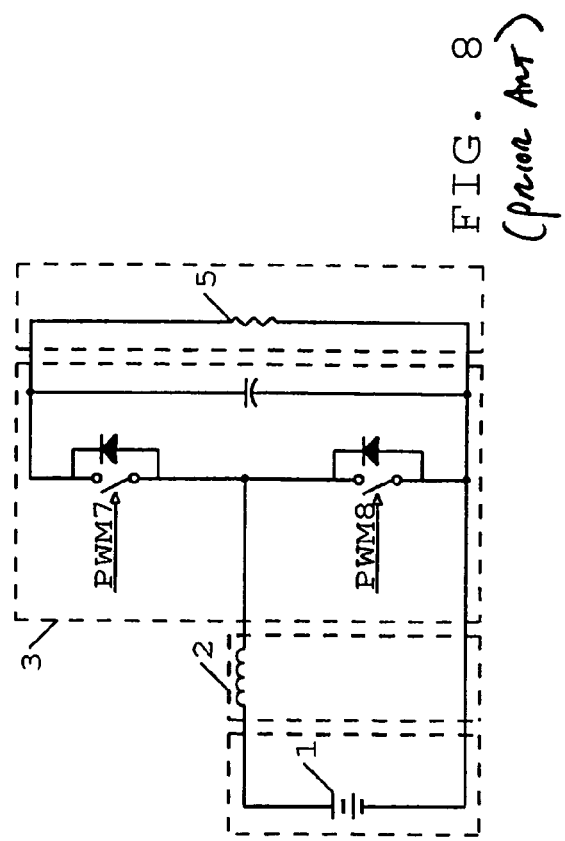
FIG. 8 is a schematic diagram of state of the art boost converter with a mono-phase load at its output.
Figure 9:
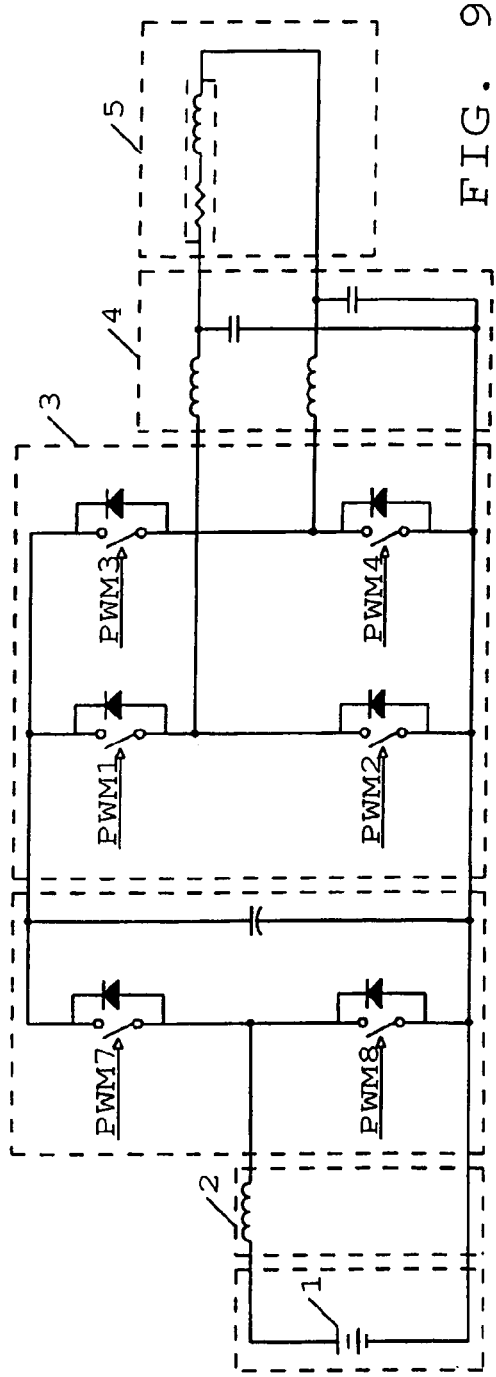
FIG. 9 is a schematic diagram of state of the art boost converter connected to a class D amplifier and a mono-phase load at its output

FIG. 8 is a standard schematic diagram of state of the art boost converter with a mono-phase load at its output. If a class D amplifier of FIG. 6 is connected instead of the load to the boost converter output, an amplifier from FIG. 9 is obtained. This solution is complex and requires a large number of switches and complex control electronics.

Figure 10:
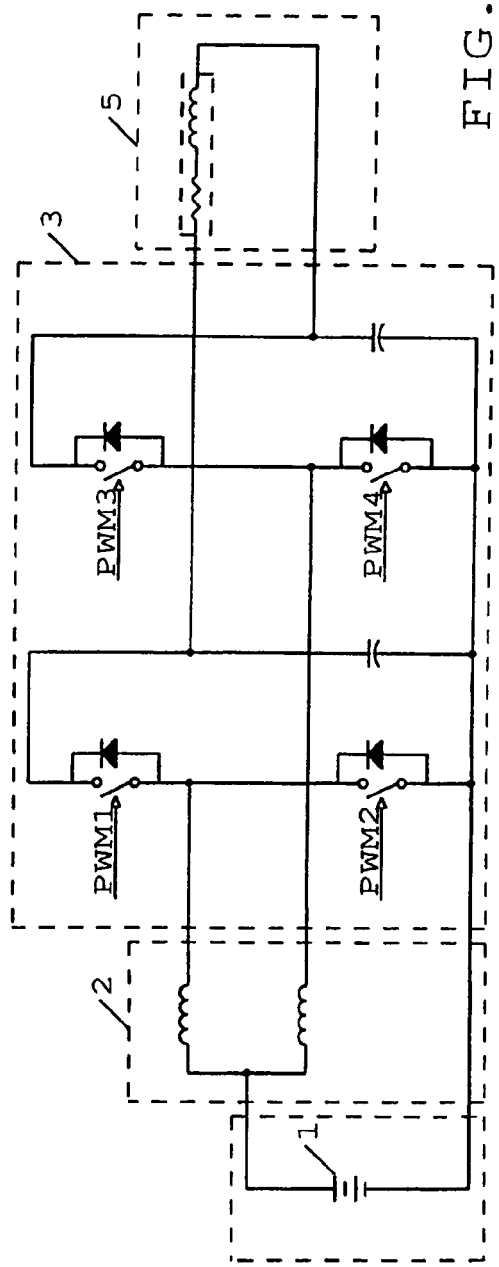
FIG. 10 is a schematic diagram of state of the art amplifier made of two boost converters and a mono-phase load at its output.

FIG. 10 is a schematic diagram of state of the art amplifier made of two boost converters and a mono-phase load at its output. The presented solution decreases the number of switches in comparison with FIG. 9 on the basis of increasing complexity of control electronics and exceptionally of voltage-current loading of switches. Namely, in absence of a modulation signal, voltages across switches reach twice the value of power supply 1 voltage, while during operation they could reach several times the value of power supply 1 voltage, which requires very complex and accurate feedback based on sensing both the input inductors currents and the capacitor voltages. In order to achieve high speed of the voltage change across the load, the output capacitors and the input inductors should be of minimal value, which leads to a very high current ripple through inductors, switches and capacitors. Both reasons many times do increase the requirements for a maximum voltage and current which switches should withstand, as well as a dissipation on all elements within this circuit.

Figure 11:
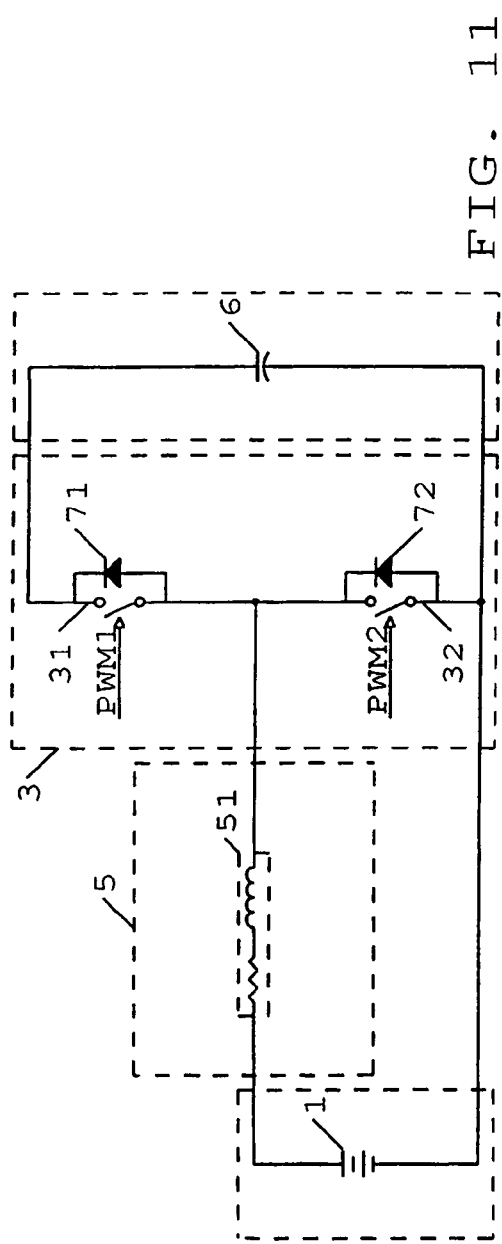
FIG. 11 is a schematic diagram of the invented BB amplifier with the bridge capacitor connected to the switching bridge ends and a mono-phase load, appropriate to the block diagram of FIG. 2.

FIG. 11 is a schematic diagram of the invented BB amplifier with the bridge capacitor 6 connected to the switching bridge 3 ends and a mono-phase load 5, appropriate to the block diagram of FIG. 2. The switching bridge 3 operation is controlled by the pulse-width modulated control signals PWM1 and PWM2, which are typically counter phased, i.e. when PWM1 is active, PWM2 is inactive and vice versa However, these signals could be controlled in some other manner, thus modifying the transfer function of the amplifier. In further description, the simplest case of the counter phase generation of control signals PWM1 and PWM2 is used, which is also most often used in practice, and well known to those skilled in the art.

Signal PWM1 is active and signal PWM2 is inactive during pulse duration within one period of pulse-width modulation. Signal PWM1 is inactive and signal PWM2 is active during duration of pause within same period. An average value of PWM1 within one period is appropriate to the modulated signal value, while average value of PWM2 within the same period is appropriate to the inverted modulated signal value.

The modulator itself can be made by the generator of a reference triangular or a sawtooth voltage and a comparator which compares the said reference voltage with an input voltage which should be modulated. The modulator can also be made by a counter in which digital words, appropriate to the binary value of input voltage samples, are written. All those modulator realizations are well known to those skilled in the art.

For active signal PWM1, the switch 31 is on and the switch 32 is off, so the current loop covers the power supply 1, the load 5, the switch 31 and the bridge capacitor 6.

For active signal PWM2, the switch 32 is on and the switch 31 is off, so the current loop covers the power supply 1, the load 5 and the switch 32.

Diodes 71 and 72 are connected in antiparallel to switches 31 and 32, respectively, and pass the current when all switches are off. The role of switches can be fulfilled by any semiconductor switches, such as bipolar transistors, mosfets or IGBT, depending on the required frequency of control signals, current, voltage and dissipation of switches. If MOSFET transistors are used as switches, said diodes 71 and 72 stand for internal parasitic diodes of MOSFET transistors, which is well known to those skilled in the art.

If the average value of PWM1 signal is less than the average value of signal PWM2, the energy from the power supply 1 is partly dissipated in the resistance of the first phase 51 of the load 5, partly increasing the energy accumulated in the inductance of the first phase 51 of the load 5 and partly increasing the energy accumulated in the bridge capacitor 6.

If the average value of PWM1 signal is greater than the average value of signal PWM2, the energy from the bridge capacitor 6 is partly dissipated in the resistance of the first phase 51 of the load 5, partly decreasing the energy accumulated in the inductance of the first phase 51 of the load 5 and partly returning to the power supply 1. Since the bridge capacitor 6 voltage is greater than the power supply 1 voltage, the current through the load 5 can change its direction and provide a negative half period of the useful signal.

However, the current through the load 5 has a DC component, due to the dissipation, which is very small at low power levels, but increases at high power levels. This problem is solved in poly-phase BB amplifiers, together with many other advantages.

Figure 12:
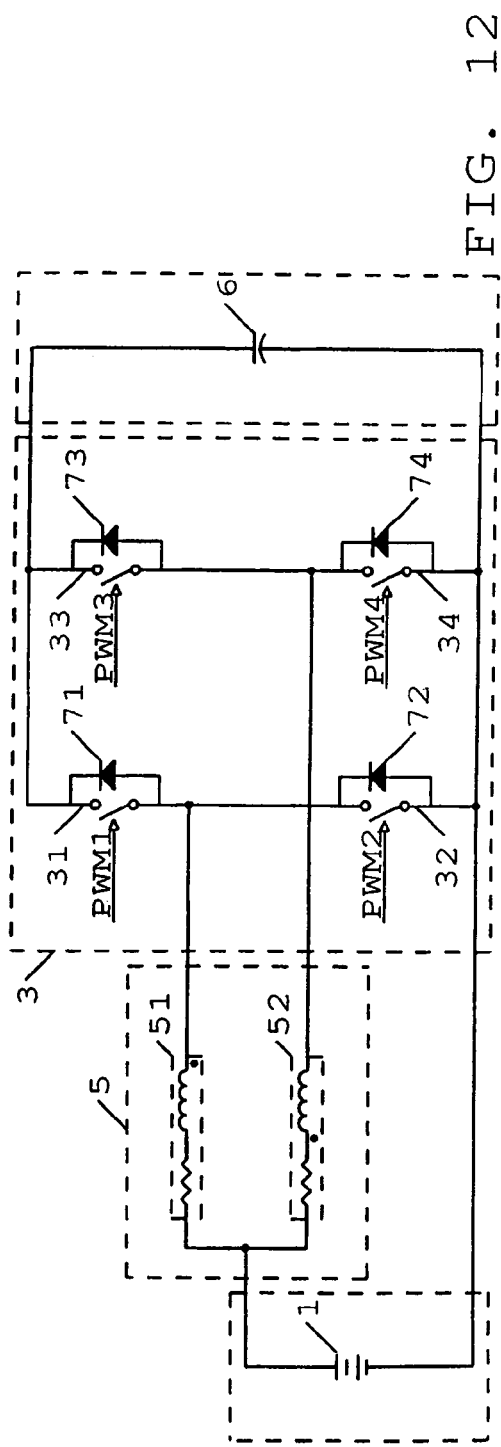
FIG. 12 is a schematic diagram of the invented BB amplifier with the bridge capacitor connected to the switching bridge ends and a two-phase load, appropriate to the block diagram of FIG. 2.

FIG. 12 is a schematic diagram of the invented BB amplifier with bridge capacitor 6 connected to the switching bridge 3 ends and a two-phase load 5, appropriate to the block diagram of FIG. 2. The switching bridge 3 operation is controlled by the pulse-width modulated control signals PWM1, PWM2, PWM3 and PWM4, which are typically counter phased for switches of the same load phase, and shifted in time for 180° between phases, i.e. when PWM1 is active, PWM2 is inactive, when PWM3 is active, PWM4 is inactive, and vice versa Signal PWM3 is activated at 180° after activation of signal PWM1. In other words, signals PWM1 and PWM4 are active in the same time interval, while PWM2 and PWM3 are inactive, and vice versa, which is well known to those skilled in the art.

For active signal PWM1, the switch 31 is on and the switch 32 is off, so the first current loop covers the power supply 1, the first phase 51 of the load 5, the switch 31 and the bridge capacitor 6.

For active signal PWM2, the switch 32 is on and the switch 31 is off, so the second current loop covers the power supply 1, the first phase 51 of the load 5 and the switch 32.

For active signal PWM3, the switch 33 is on and the switch 34 is off, so the third current loop covers the power supply 1, the second phase 52 of the load 5, the switch 33 and the bridge capacitor 6.

For active signal PWM4, the switch 34 is on and the switch 33 is off, so the fourth current loop covers the power supply 1, the second phase 52 of the load 5 and the switch 34.

Diodes 71, 72, 73 and 74 are connected in antiparallel to switches 31, 32, 33 and 34, respectively, and pass the current when all switches are off.

In case of zero average value of modulated signal (for instance a sinewave signal), the average values of all control signals PWM1, PWM2, PWM3 and PWM4 are identical, so the average values, i.e. DC current components through both phases 51 and 52 of the load 5 are identical and recharge the bridge capacitor 6.

In most loads of dual voice coil loudspeaker type, the inductances of both phases 51 and 52 of the load 5 are coupled. If the inductances of both phases 51 and 52 of the load 5 are coupled, average current values through both phases 51 and 52 are directed from the power supply 1 to the bridge capacitor 6, so their fluxes will cancel each other according to the reference markers shown. Thus the average value of summary flux equals zero, so the magnetic material of the load 5 is much better utilized in comparison with a solution of FIG. 11. The average force value generated by mentioned average currents is also canceled to zero.

However, the modulated current components through the first phase 51 and the second phase 52 of the load 5 have opposite directions regarding the power supply 1, so their fluxes will add according to the reference markers shown. Thus the modulated force values, produced by mentioned modulated currents, are also added.

A special quality of the presented solution is practical insensitivity to variations of the power supply 1 voltage which produce identical currents in symmetrical inductances of both phases 51 and 52 of the load 5, so their fluxes and forces cancel each other.

Another special quality of the presented solution is practical insensitivity to variations of the bridge capacitor 6 voltage, which produce identical currents in symmetrical inductances of both phases 51 and 52 of the load 5, so their fluxes and forces cancel each other.

FIG. 13 is a schematic diagram of the invented BB amplifier with the bridge capacitor 6 connected to the switching bridge 3 ends and a three-phase load 5, appropriate to the block diagram of FIG. 2. The switching bridge 3 operation is controlled by the pulse-width modulated control signals PWM1, PWM2, PWM3, PWM4, PWM5 and PWM6, which are typically counter phased for switches of the same load phase, and shifted in time for 120° between phases, i.e. when PWM1 is active, PWM2 is inactive, when PWM3 is active, PWM4 is inactive, when PWM5 is active, PWM6 is inactive, and vice versa Signal PWM5 is activated 120° after activation of signal PWM3, while signal PWM3 is activated 120° after activation of signal PWM1, which is well known to those skilled in the art.

For active signal PWM1, the switch 31 is on and the switch 32 is off, so the first current loop covers the power supply 1, the first phase 51 of the load 5, the switch 31 and the bridge capacitor 6.

For active signal PWM2, the switch 32 is on and the switch 31 is off, so the second current loop covers the power supply 1, the first phase 51 of the load 5 and the switch 32.

For active signal PWM3, the switch 33 is on and the switch 34 is off, so the third current loop covers the power supply 1, the second phase 52 of the load 5, the switch 33 and the bridge capacitor 6.

For active signal PWM4, the switch 34 is on and the switch 33 is off, so the fourth current loop covers the power supply 1, the second phase 52 of the load 5 and the switch 34.

For active signal PWM5, the switch 35 is on and the switch 36 is off, so the fifth current loop covers the power supply 1, the third phase 53 of the load 5, the switch 35 and the bridge capacitor 6.

For active signal PWM6, the switch 36 is on and the switch 35 is off, so the sixth current loop covers the power supply 1, the third phase 53 of the load 5 and the switch 36.

Diodes 71, 72, 73, 74, 75 and 76 are connected in antiparallel to switches 31, 32, 33, 34, 35 and 36, respectively, and pass the current when all switches are off.

In case of zero average value of modulated signal (for instance a sinewave signal), the average values of all control signals PWM1, PWM2, PWM3, PWM4, PWM5 and PWM6 are identical, so the average values, i.e. DC current components through all three phases 51, 52 and 53 of the load 5 are identical and recharge the bridge capacitor 6.

In most loads of three phase induction electric motor and three phase brushless DC electric motor types, the inductances of all three phases 51, 52 and 53 of load 5 are coupled. If the inductances of all three phases 51, 52 and 53 of load 5 are coupled, the average current values through all three phases 51, 52 and 53 are directed from the power supply 1 to the bridge capacitor 6, so their fluxes will cancel each other according to reference markers shown. Thus the average value of summary flux equals zero, so the magnetic material of the load 5 is much better utilized in comparison with a solution of FIG. 11. The average force value generated by mentioned average currents is also canceled to zero.

However, modulated current components through the first phase 51, the second phase 52 and the third phase 53 of the load 5 have additive directions regarding the power supply 1, so their fluxes will add according to the reference markers shown. Thus modulated force values, produced by mentioned modulated currents, are also added.

A special quality of the presented solution is practical insensitivity to variations of power supply 1 voltage which produce identical currents in symmetrical inductances of all three phases 51, 52 and 53 of the load 5, so their fluxes and forces cancel each other.

Another special quality of the presented solution is practical insensitivity to variations of bridge capacitor 6 voltage, which produce identical currents in symmetrical inductances of all three phases 51, 52 and 53 of the load 5, so their fluxes and forces cancel each other.

FIGS. 14, 15 and 16 are schematic diagrams of the invented BB amplifier with the bridge capacitor 6 connected to the switching bridge 3 ends, output L filter 4 and mono-phase, two-phase and three-phase load, respectively, appropriate to the block diagram of FIG. 3. The output L filter 4, connected between each phase of the load 5 and the appropriate input of the switching bridge 3, serve to additionally filter current through the load 5. The output L filter 4 consists of the first filtering inductance 41 in case of mono-phase load 5, two filtering inductances 41 and 42 in case of two-phase load 5, and three filtering inductances 41, 42 and 43 in case of three phase load 5. The first reason for the application of the output L filter 4 is relatively small inductance of the load 5, thus recommending utilization of the toroidal inductance, in order to decrease the radiated noise. The second reason for the output L filter 4 application is the additional attenuation of disturbances from the switching bridge 3, thus recommending utilization of ferrite beads.

Figure 17:
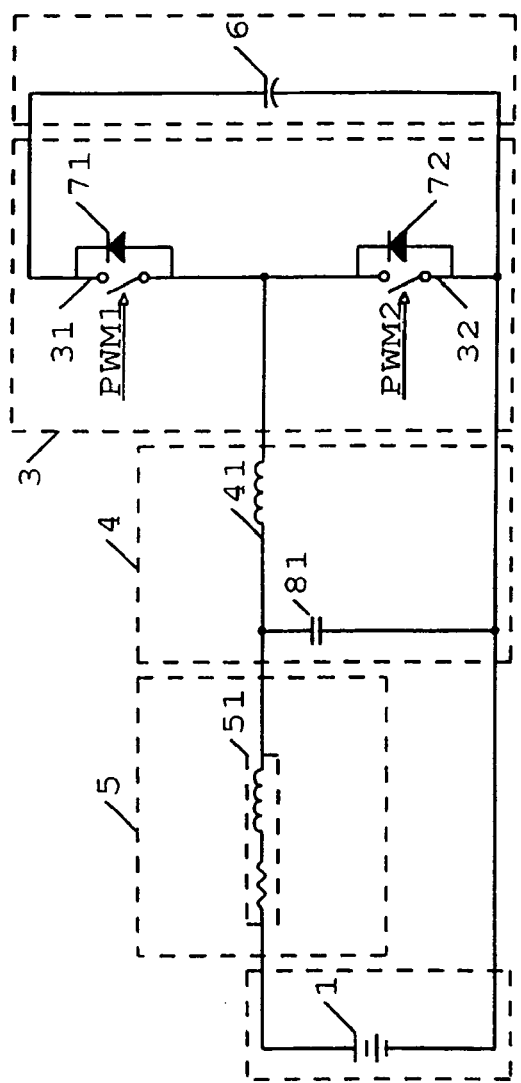
FIG. 17 is a schematic diagram of the invented BB amplifier with the bridge capacitor connected to the switching bridge ends, output LC filter and a mono-phase load, appropriate to the block diagram of FIG. 3.
Figure 18:
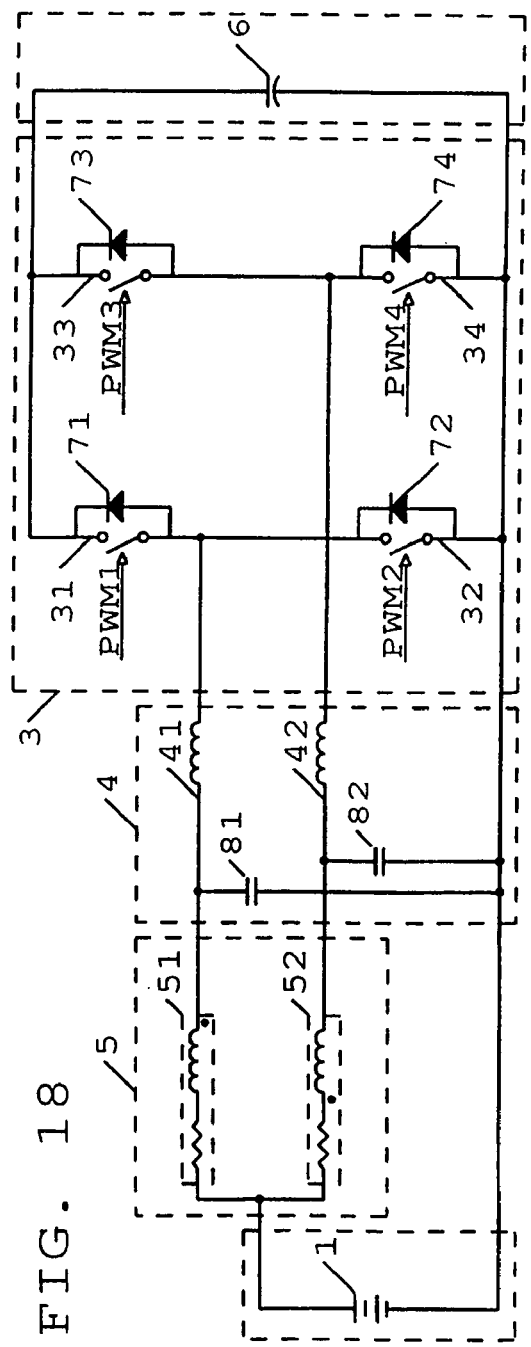
FIG. 18 is a schematic diagram of the invented. BB amplifier with the bridge capacitor connected to the switching bridge ends, output LC filter and a two-phase load, appropriate to the block diagram of FIG. 3.
Figure 19:
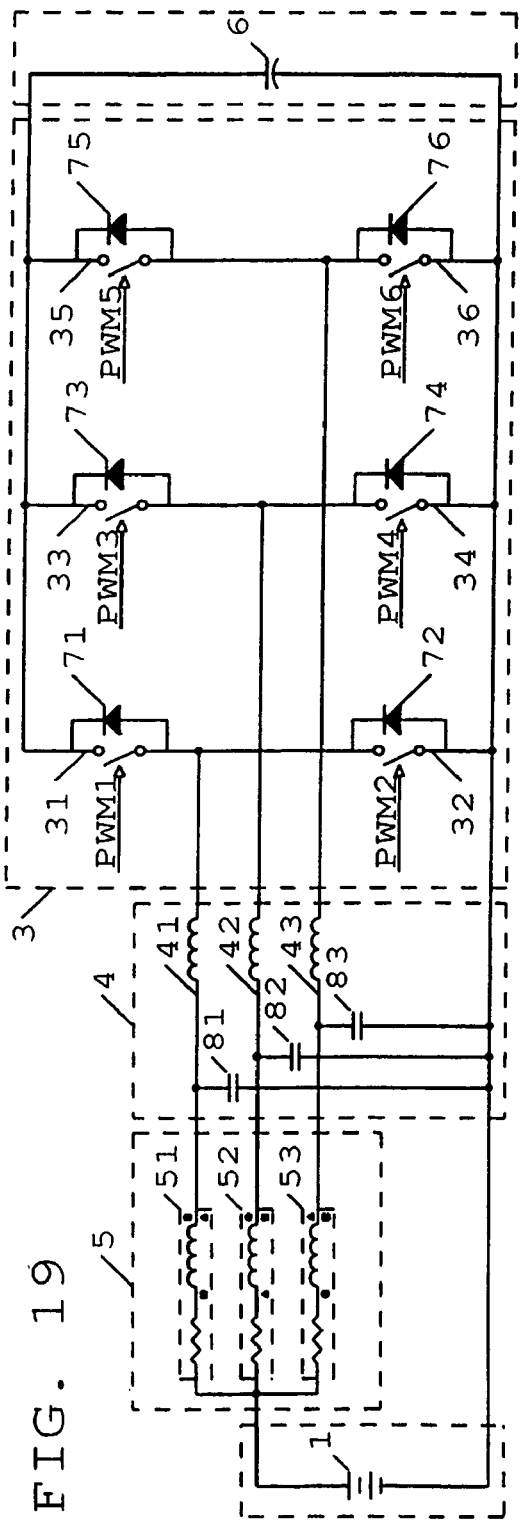
FIG. 19 is a schematic diagram of the invented BB amplifier with the bridge capacitor connected to the switching bridge ends, output LC filter and a three-phase load, appropriate to the block diagram of FIG. 3.

FIGS. 17, 18 and 19 are schematic diagrams of the invented BB amplifier with the bridge capacitor 6 connected to the switching bridge 3 ends, output LC filter 4 and mono-phase, two-phase and three-phase load, respectively, appropriate to the block diagram of FIG. 3. The output LC filter 4, connected between each phase of the load 5 and the appropriate input of the switching bridge 3, serve to additionally filter current through the load 5. The output LC filter 4 consists of the first filtering inductance 41 and the first filtering capacitance 81, in case of the mono-phase load 5, two filtering inductances 41 and 42, and two filtering capacitances 81 and 82, in case of the two-phase load 5, and three filtering inductances 41, 42 and 43, and three filtering capacitances 81, 82 and 83, in case of the three phase load 5. The first reason for the application of output LC filter 4 is the utilization of long cables between BB amplifier and the load 5, thus recommending utilization of the toroidal inductance, in order to decrease the radiated noise. The second reason for the output LC filter 4 application is the additional attenuation of disturbances from the switching bridge 3, thus recommending utilization of ferrite beads.

Figure 20:
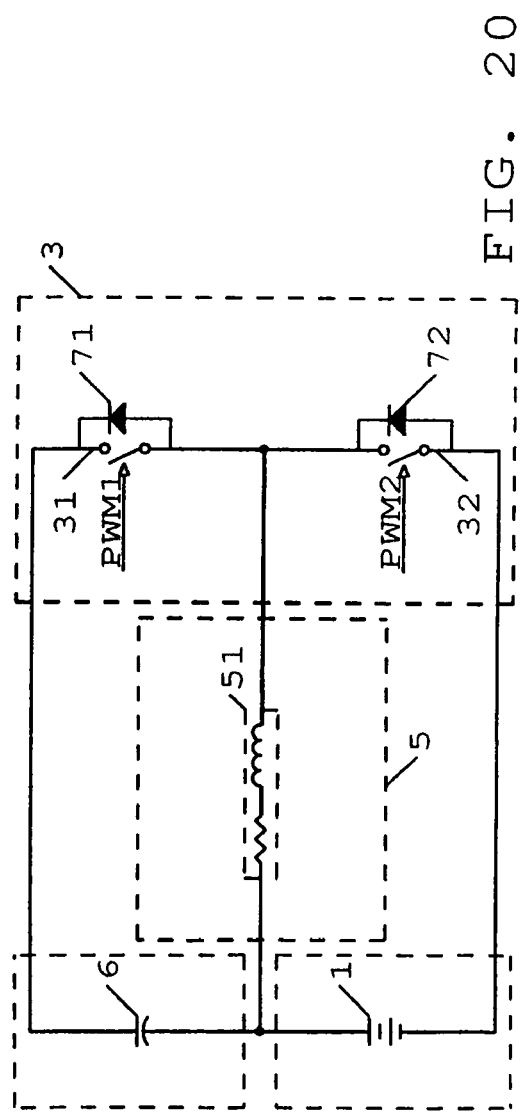
FIG. 20 is a schematic diagram of the invented BB amplifier with the bridge capacitor connected between the switching bridge and the power supply, and a mono-phase load, appropriate to the block diagram of FIG. 4.
Figure 21:
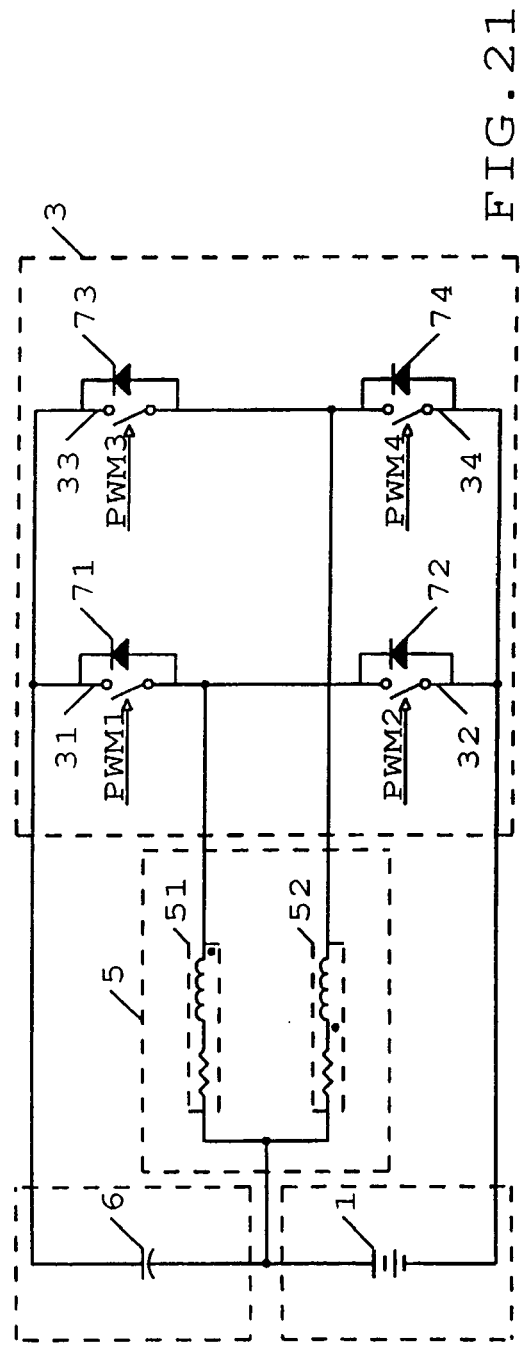
FIG. 21 is a schematic diagram of the invented BB amplifier with the bridge capacitor connected between the switching bridge and the power supply, and a two-phase load, appropriate to the block diagram of FIG. 4.
Figure 22:
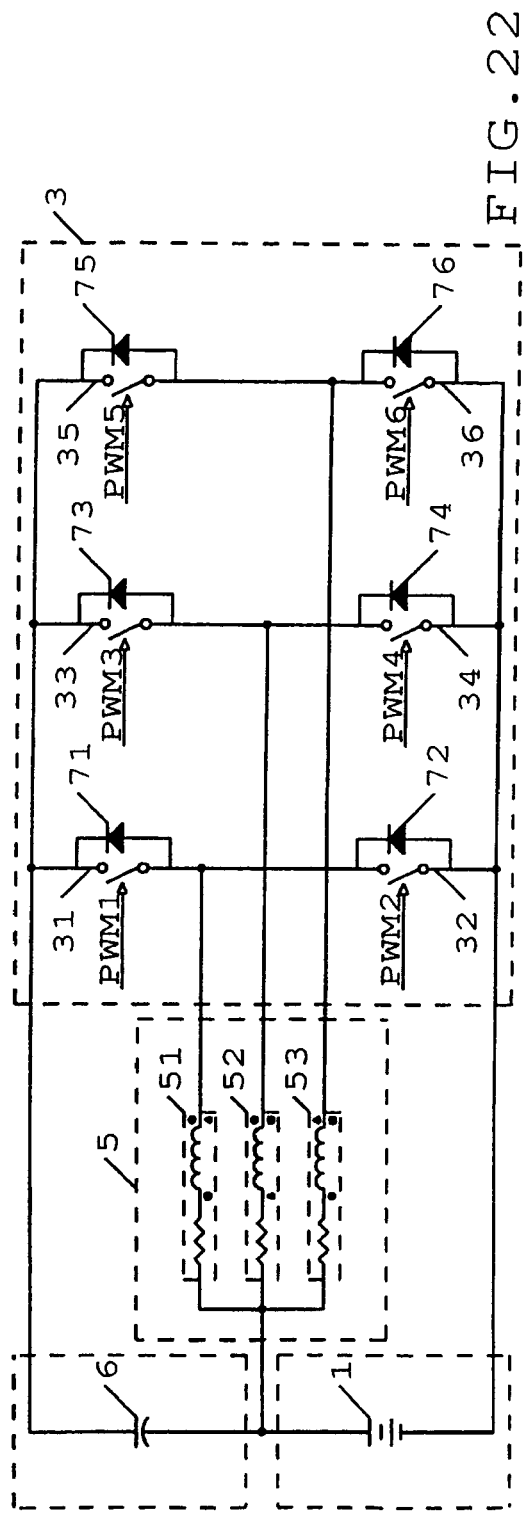
FIG. 22 is a schematic diagram of the invented BB amplifier with the bridge capacitor connected between the switching bridge and the power supply, and a three-phase load, appropriate to the block diagram of FIG. 4.
Figure 23:
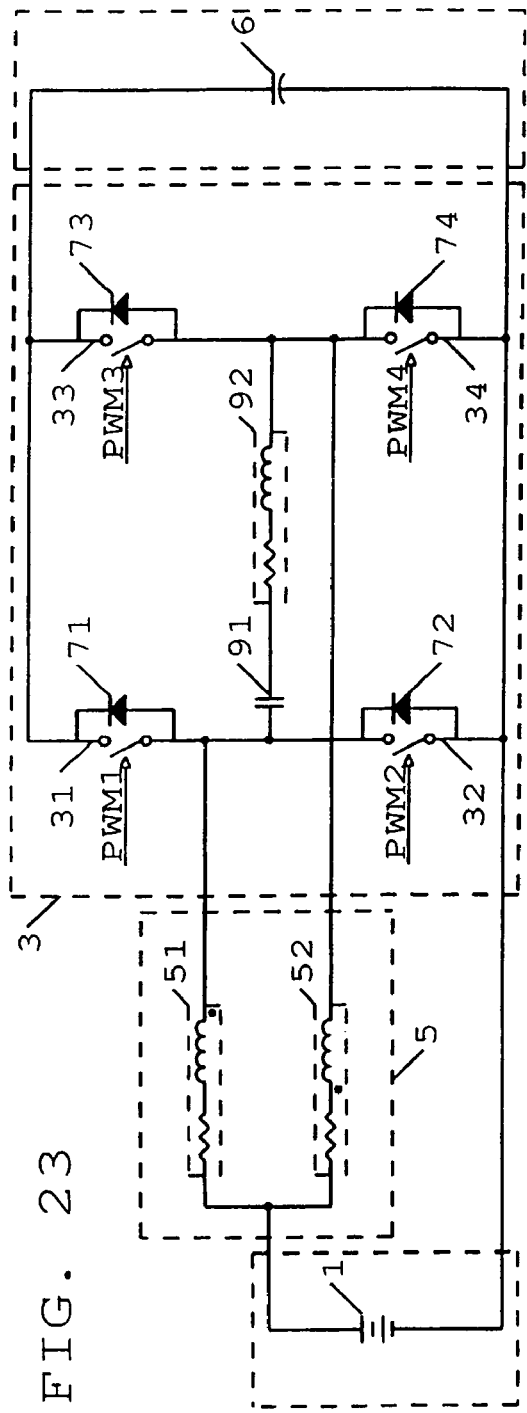
FIG. 23 is a schematic diagram of the invented BB amplifier with the bridge capacitor connected to the switching bridge ends, a two-phase load and a mono-phase additional load, appropriate to the BB amplifier of FIG. 12.
Figure 24:
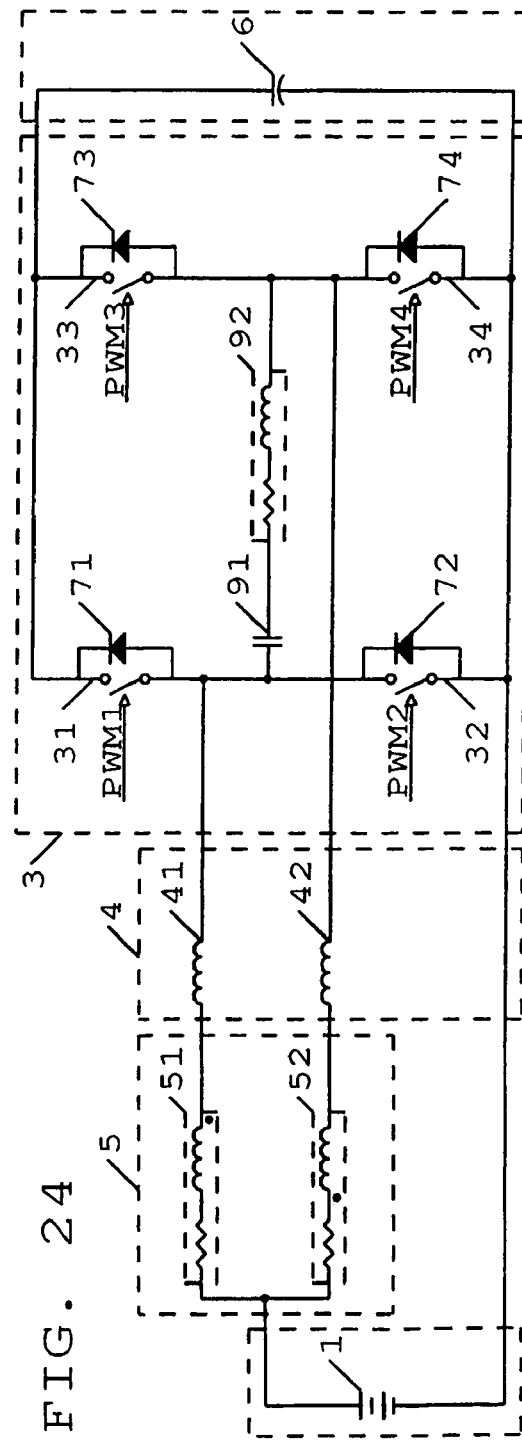
FIG. 24 is a schematic diagram of the invented BB amplifier with the bridge capacitor connected to the switching bridge ends, a two-phase load and a mono-phase additional load, appropriate to the BB amplifier of FIG. 15.
Figure 25:
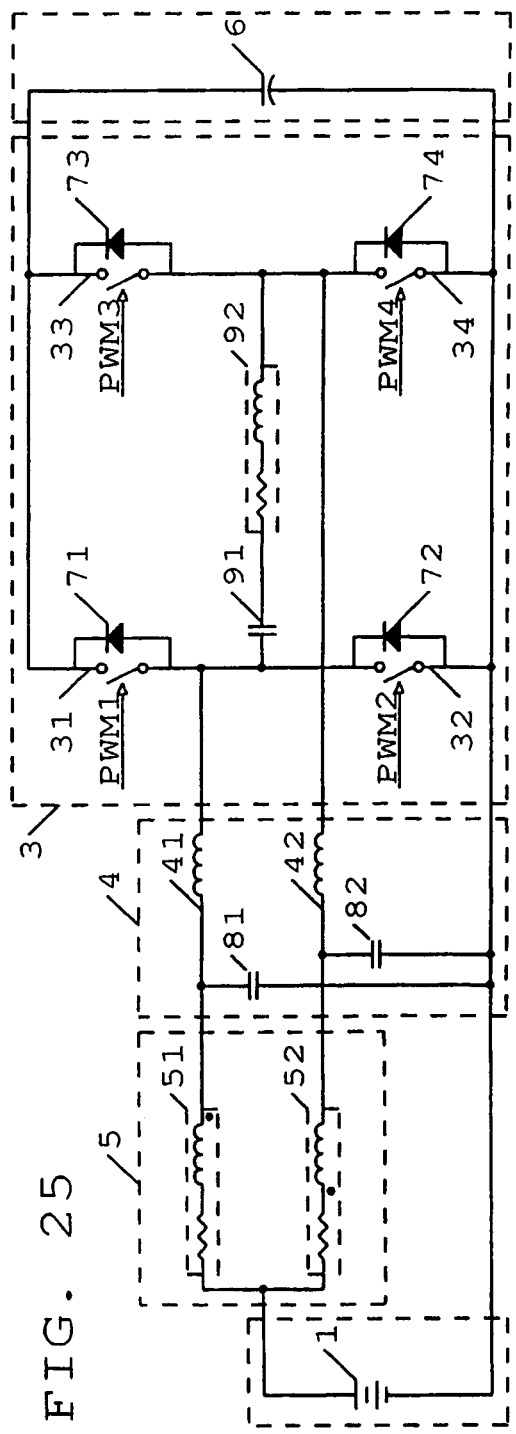
FIG. 25 is a schematic diagram of the invented BB amplifier with the bridge capacitor connected to the switching bridge ends, a two-phase load and a mono-phase additional load, appropriate to the BB amplifier of FIG. 18.
Figure 26:
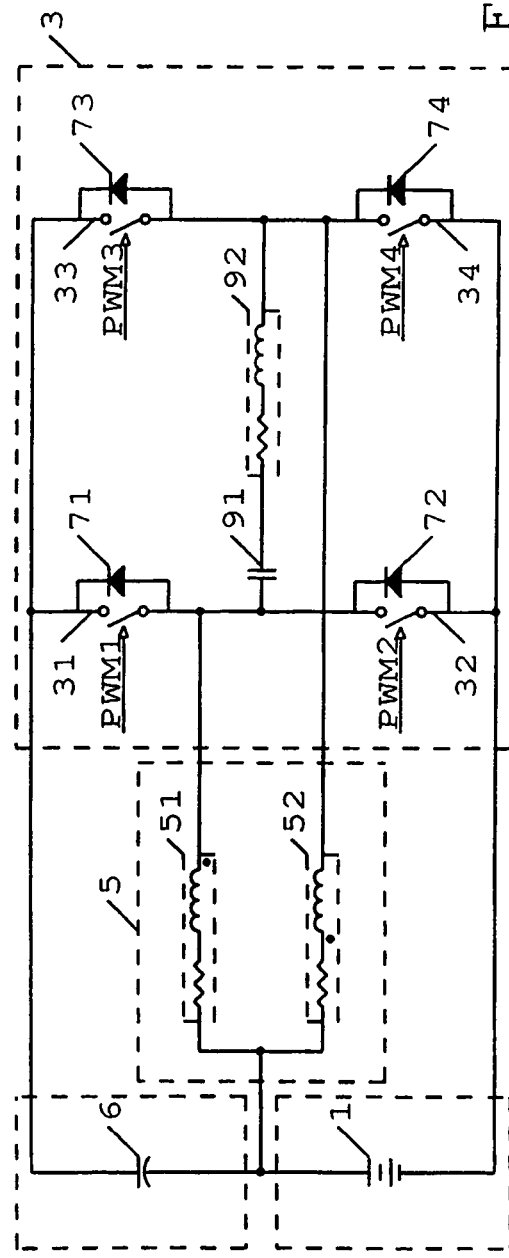
FIG. 26 is a schematic diagram of the invented BB amplifier with the bridge capacitor connected to the switching bridge ends, a two-phase load and a mono-phase additional load, appropriate to the BB amplifier of FIG. 21.

FIGS. 20, 21 and 22 are schematic diagrams of the invented BB amplifier with the bridge capacitor 6 connected between the switching bridge 3 and the power supply 1, with mono-phase, two-phase and three-phase load, respectively, appropriate to the block diagram of FIG. 4. The bridge capacitor 6 voltage does not exceed power supply 1 voltage, enabling the decrease of size, weight and price of BB amplifier. This solution is not recommended in case of high disturbance at the power supply 1, because they would be directly coupled to the switching bridge 3, canceling advantages of BB amplifier over state of the art class D amplifiers.

FIGS. 24, 25, 26 and 27 are schematic diagrams of the invented BB amplifier with the bridge capacitor 6 connected to switching bridge ends, two-phase main load 5 and mono-phase additional load 92. In the audio field, often one or more tweeter loudspeakers are separated by filtering capacitances and connected in parallel to the main loudspeaker. BB amplifier requires a dual voice coil loudspeaker as a two-phase main load 5. However, a tweeter loudspeaker with a single voice coil as a mono-phase additional load 92 can be connected between the switching bridge 3 inputs through a filtering capacitor 91.

Figure 27:
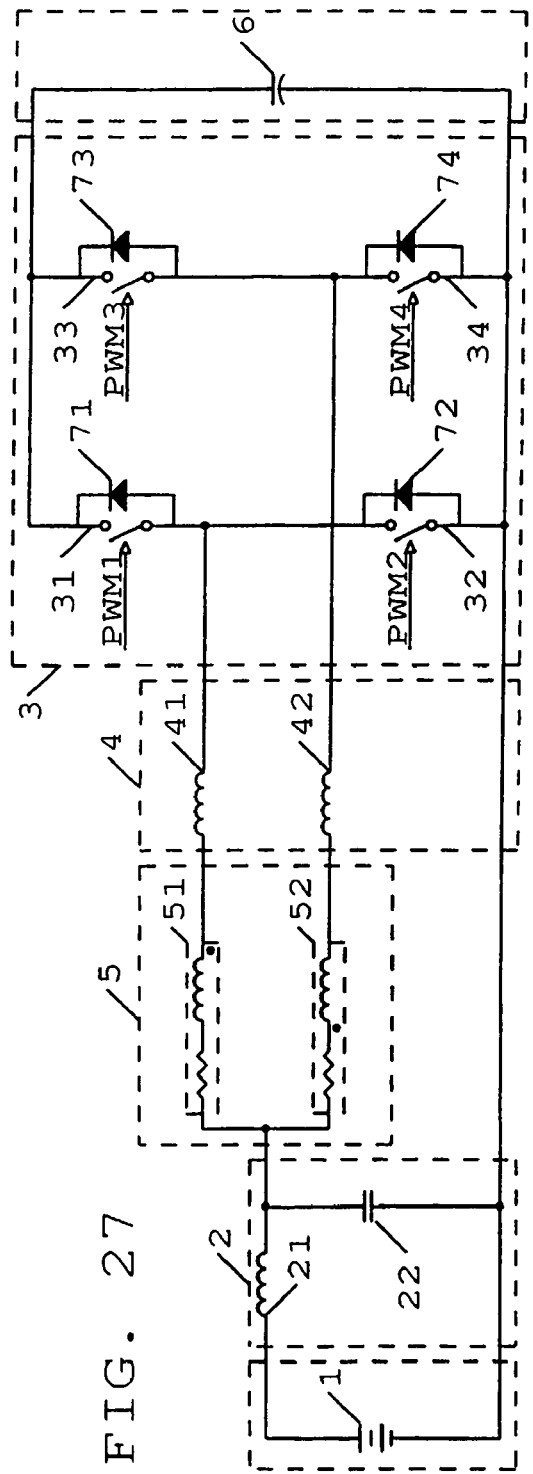
FIG. 27 is a schematic diagram of the invented BB amplifier of FIG. 15 modified with an input filter between the power supply and the load.

FIG. 27 is a schematic diagram of BB amplifier of FIG. 15 modified with an input filter 2 for the additional attenuation of conducted EMI noise over a cable connecting the power supply 1 and the load 5. The input filter 2 is realized in a form of a standard LC filter with an input filtering inductor 21 and input filtering capacitor 22. Although the same number of components is utilized as in an input filter 2 of state of the art class D amplifiers, the values of both filtering elements in the input filter 2 inside BB amplifier are several orders of magnitude less, because the current ripple, passing through the load 5 inside BB amplifier, is several orders of magnitude less than the current ripple passing through the switching bridge 3 of state of the art class D amplifiers.

Figure 28:
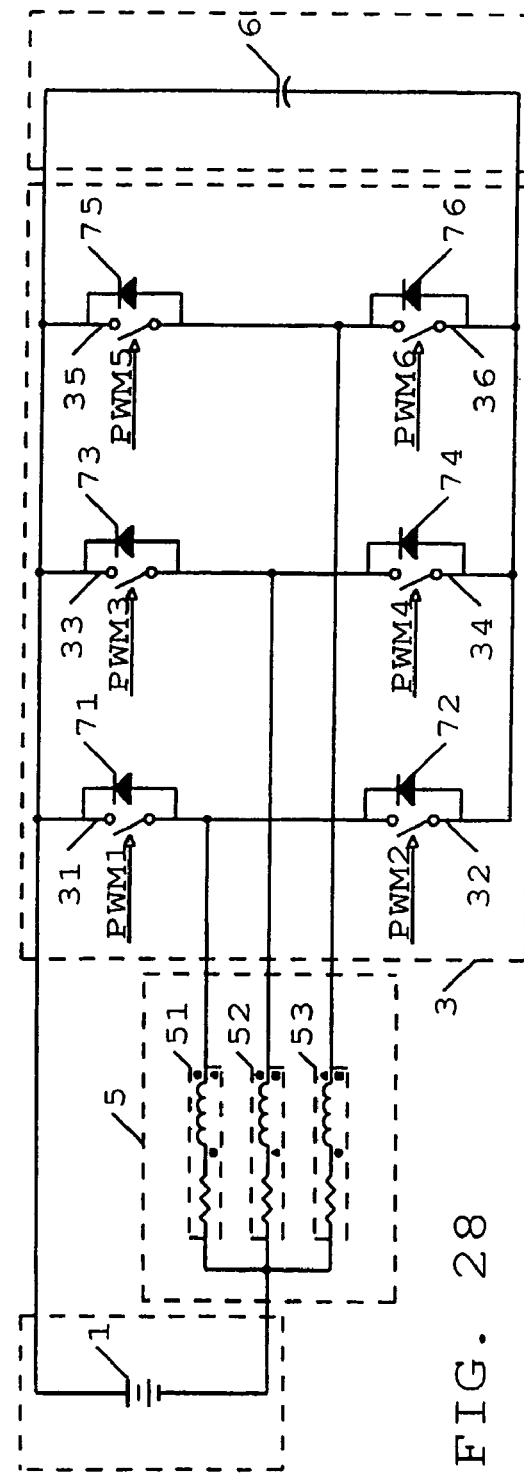
FIG. 28 is a schematic diagram of the invented BB amplifier of FIG. 13 modified with shifted power supply, in order to provide grounded load.

In distinction to state of the art class D amplifiers, it is possible to ground the load 5 node connected to the power supply 1. In depicted FIGS. 11 to 26, this means the connection of a positive node of the power supply 1 to the ground. In case that a negative node of power supply 1 grounding is required, it is necessary to connect a negative node of the power supply 1 to the common node of all phases of the load 5, and to reconnect a positive node of the power supply 1 to the second node of the bridge capacitor 6, which does not change the essence of the BB amplifier operation. This sort of reconnection is illustrated in FIG. 28 for the case of three-phase load 5.

INDUSTRIAL APPLICABILITY

Rms power of BB amplifier is increasing linear proportionally to the number of added identical phases. However, if the existing load is divided into several phases, keeping the summary impedance independent of the number of phases, rms power of BB amplifier is increasing quadratically with the number of phases. The number of phase increase to 4, 5 or as much as necessary depending on the load 5, is performed by simple addition of new switches in the switching bridge 3, which is well known to those skilled in the art.

Maximum voltage at the bridge capacitor 6 is limited inherently to twice the value of the power supply 1 voltage without using any feedback, in distinction with boost converters where this voltage is unlimited, which without feedback could lead to switches breakthrough. At full load, this voltage at the bridge capacitor 6 is failing to 4/3 of power supply 1 voltage, which limits maximum continuous (rms) power to around 2 times greater than rms power of state of the art class D amplifiers, at the same power supply voltage and the same load 5 impedance.

The crest factor as a ratio of maximum peak power to rms power expressed in dB, is a very important parameter in the field of audio power amplifiers. The crest factor for a sinewave signal is only 3.01 dB, i.e. the peak power is only 2 times higher than the rms power. The analysis of various musical genres, from classical, pop, rock to jazz, shows a variation in crest factor from a minimum of 11 dB for pop and rock to a maximum of 21 dB for some classical or jazz music, which corresponds to a ratio of peak power to rms power from the minimum of 11.6 to the maximum of 126. In audio application it could be assumed that the average crest factor is about 15 dB, i.e. 31.6 times for the majority of the musical content.

Consequently, in case of music signal amplification, rms power is relatively small, so the bridge capacitor 6 voltage reaches almost 2 power supply voltages. From there, a peak power of two-phase BB amplifier for a music signal is more than 4 times greater than the peak power of state of the art class D amplifiers with same power supply voltage and same load 5 impedance. The power consumption of BB amplifiers, as well as state of the art class D amplifiers, in case of music signal amplification is 2.5 times less than for the best state of the art linear amplifiers in classes B and AB, in the conditions of the same output power.

For instance, in automotive electronics with power supply voltage of 14.4V, loudspeaker impedance of 4 Ohms and distortion of 1%, class AB amplifiers achieve only 19 W rms and 38 W peak power, class D amplifiers achieve 21 W rms and 42 W peak power, while BB amplifier using serially connected 2+2 Ohms loudspeaker achieves 42 W rms and 193 W peak power.

For instance, in automotive electronics with power supply voltage of 14.4V, loudspeaker impedance of 4 Ohms and distortion of 10%, class AB amplifiers achieve 25 W rms and 40 W peak power, class D amplifiers achieve 27 W rms and 42 W peak power, while BB amplifier using serially connected 2+2 Ohms loudspeaker achieves 50 W rms and 230 W peak power.

It follows that BB amplifier is exceptionally adapted to amplify music signals in vehicles, showing all its advantages. Moreover, standard dual voice coil loudspeakers are made for higher power, so the application of BB amplifier does not require any change in the existing technology of loudspeaker manufacturing.

Similar situation is valid for BB amplifier application in the field of electric motor drives. Namely, in order to provide better transient response, particularly during the acceleration of an electric motor, a significant power reserve is required, which is successfully provided by the bridge capacitor 6. During normal operation, the necessary power of most electric motor drives is much less, which is appropriate to the crest factor of at least 6 dB, i.e. 4 times. For instance, very high power is required in electric cars during start and acceleration during overtake, for which BB amplifier represents an ideal solution. Moreover, standard induction electric motors and brushless DC motors are already connected in so-called star configuration, so the application of BB amplifiers does not require any modification in the present technology of the electric motor manufacturing.

Standard amplifiers of all classes during too large sinewave signal at input limit output signal by cutting off sinewave peaks, thus leading to a very high distortion. In distinction to them, BB amplifier with the help of coupled inductances in the load 5 features much less distortion Namely, in case of too large input signal, currents through inductances become distorted in the same way, that their difference is very little distorted. Since current difference is proportional to the force, for example, for moving a loudspeaker cone, or rotating the rotor of an electric motor, thus the distortion of either sound or angular velocity of a shaft of an electric motor is very small.

BB amplifier provides the cancellation of high frequency current ripple in coupled inductances of the load 5, thus providing practically DC current from the power supply 1 with the superposed low frequency of music signal or signal for controlling an electric motor, which is below the frequency range of conducted EMI noise. In case that the additional filtering of the power supply 1 current is required, it is possible to connect standard input LC filter 2 between the power supply 1 and BB amplifier, according to a block diagram of FIG. 3.

BB amplifier limits the current circuit with pulse currents to the small area contour connecting the switching bridge 3 and the bridge capacitor 6, thus dramatically decreasing the radiated emission, and eliminating completely the conducted and radiated EMI noise emanating from the cable connecting the power supply 1 and the load 5. A current loop with pulse current for state of the art class D amplifiers is closed through an input filter 2, a cable and the power supply 1, thus increasing the conducted and radiated EMI noise.

As modern personal computers are using lower power supply voltages for supplying microprocessors and memories, 12V voltage is utilized practically only for hard disc supply and audio amplifiers. Using BB amplifiers for hard disk electric motors supply and BB audio amplifiers it is possible to completely eliminate 12V power supply voltage, by keeping good dynamic behavior in both applications.

The special feature of BB amplifier is a multiple utilization of load 5 impedance, unexploited in an engineering practice since:

1. The load 5 is decreasing amplifier distortion due to coupled inductances, thus providing the use of the most standard and the most economical feedback Measurements show that the acoustic performance of BB amplifier with dual voice coil loudspeaker is identical or even slightly better than the acoustic performance of reference laboratory class A amplifier using the same loudspeaker with serially connected voice coils, in order to achieve the same impedance.

2. The load 5 serves as an input filter, eliminating influence of power supply 1 noise to its own summary current. For the ideally symmetrical coils of the load 5, the theoretical power supply rejection factor is infinite. In this manner, BB amplifier feedback shows only a secondary role. This solves one of the basic problems of state of the art class D amplifiers, whose feedback provides a typical power supply rejection factor at high audio frequencies of only 40 dB. The special complicated feedback could increase this factor up to 60 dB, which is appropriate to state of the art linear amplifiers in classes A, B and AB. This feature is very important in automotive electronics where the power supply noise is even greater for the order of magnitude than the power supply voltage itself.

3. The load 5 serves as an output filter, eliminating influence of the switching bridge 3 noise to its own summary current. This avoids above mentioned problem of load 5 impedance influence to an amplitude response of a class D amplifier using the output LC filter, drastically reducing the price and size of the amplifier, as well as distortions due to the excursions of the output LC filter inductance into saturation during high signal magnitudes. The amplifier efficiency is also increased by decreasing current ripple through the switches, with the help of relatively high own inductance of the load 5, in relation to state of the art solution with small filter inductances in output LC filter, and especially in relation to the solution with Sobel filter. BB amplifier besides its own inductance of the load 5, successfully utilizes even parasitic distributed capacitance between the coils of the load 5 as a filtering element.

4. The load 5 limits initial charging current of the bridge capacitor 6 during power on and power supply voltage transients, with the help of its own resistance, even when all switches in the switching bridge 3 are off, in distinction to the existing boost converters where this current is limited only by small parasitic resistance of an input inductor.

5. The load 5 limits the current through a Zener diode or similar voltage limiter connected in parallel to the bridge capacitor 6, with the help of its own resistance, even when all switches in the switching bridge 3 are off, in distinction to the existing boost converters where this current is limited only by small parasitic resistance of an input inductor. This is very important in automotive electronics, where during broken connection between an alternator and a battery, high energy pulse, the so-called "load dump", is generated, with voltage level up to 80V and duration of up to 0.5 s.

The summary characteristics of BB amplifier in relation to state of the art solutions using the example of two-phase BB amplifier during the reproduction of music-like signals are:
- increase in maximum continuous (rms) power by a factor of 2 for the same load 5 summary impedance and power supply 1 voltage;
- increase in maximum peak power by a factor of 4 for the same load 5 summary impedance and power supply 1 voltage;
- decrease in distortion at the same rms and peak power near maximum power;
- it contains only 4 pulse-width modulated switches in the switching bridge 3;
- complete elimination or significant reduction in size and price of the input filter 2;
- complete elimination or significant reduction in size and price of the output filter 4;
- significant reduction in weight of the amplifier as a consequence of reduction of number of components;
- significant reduction in size of the amplifier as a consequence in reduction of number of components;
- considerable reduction of conducted EMI noise along the power supply cable between the load 5 and the power supply 1;
- considerable reduction of radiated EMI noise;
- increased efficiency of the amplifier due to the elimination of resistance of the input filter 2, output filter 4 and reduction of current ripple through PWM switches in the switching bridge 3;
- reduction of generated heat and amplifier temperature;
- considerable decrease of consumption from the power supply 1 for 2.5 times in relation to linear amplifiers in classes B and AB;
- increase in power supply rejection factor;
- decrease of initial charging current for the bridge capacitor 6 and its life extension;
- the price decrease of a Zener diode or similar voltage limiter and its life extension;
- considerable decrease in the price of the entire amplifier (for about 2 times) in relation to class D amplifiers having only one half of rms power and only one fourth of the peak power, due to elimination of filter elements;
- drastic decrease in the price of the entire amplifier (for about 10 times) in relation to additional linear class A, B and AB amplifiers with boost converter as a power supply, having the same rms power and only one half of the peak power, resulting from the elimination of power supply and heatsink, and use of smaller power transistors; and
- possibility to increase the output power up to 8 times by the use of loudspeakers having impedance of 0.5 Ohms in relation to impedance of 4 Ohms.

Although the preferred embodiments of the present invention are described and illustrated, those skilled in the art can perform various modifications and design equivalents of this invention. For instance, the role of semiconductor switches can be performed using any known active semiconductor components, such as mosfets, IGBT, bipolar transistors, MCT, etc.

It is also possible to further supplement the embodiments of this invention by an input filter 2 between the power supply 1 and the load 5. Said input filter 2 is typically made on the basis of FIGS. 5, 6, 7 and 27 according to the state of the art, although much complex realizations are possible. In some cases, said input filter 2 can be treated as a part of the power supply 1, such as LC filter of switching and LC or C filter of linear power supplies.

The power supply 1 can be connected between the top node of the switching bridge 3 and the load 5, instead between the load 5 and bottom node of the switching bridge 3. In such case, the load 5 can be grounded in the center node for all phases. It is also possible to add an arbitrary number of phases inside the switching bridge 3 in case of the load 5 with the arbitrary number of phases, which does not change the spirit of this invention.

Such variations and equivalents should not be regarded as a departure from the spirit and the scope of the present invention. Thus, the present invention is intended to cover all such alternatives and modifications obvious to those skilled in the art, within the scope of the following claims.

We claim:

1. A boost bridge amplifier comprising:
a power supply (1), having a first and a second nodes,
a poly-phase load (5), having a first and a end nodes per each phase,
a switching bridge (3), having a first and a second nodes, common for all phases, and an output node per each phase,
a bridge capacitor (6), having a first and a second nodes, characterized in that,
the first node of said power supply (1) is connected to the first node of each phase of said load (5),
the second node of said power supply (1) is connected to the second node of said switching bridge (3) and the second node of said bridge capacitor (6),
the first node of said bridge capacitor (6) is connected to the first node of said switching bridge (3),
the second node of each phase of said load (5) is connected to the output node of the appropriate phase of said switching bridge (3),
the load (5) comprises resistance and smoothing inductance connected in series and
the power supply (1) is DC power supply.

2. The boost bridge amplifier of claim 1, wherein
the second node of a first phase (51) of said load (5) is connected to the third node of said switching bridge (3),
the first active switch (31) of said switching bridge (3) is connected between the first and third nodes of said switching bridge (3),
the first diode (71) anode is connected to the third node of said switching bridge (3), and the first diode (71) cathode is connected to the first node of said switching bridge (3),
the second active switch (32) of said switching bridge (3) is connected between the third and second nodes of said switching bridge (3), and
the second diode (72) anode is connected to the second node of said switching bridge (3), and the second diode (72) cathode is connected to the third node of said switching bridge (3).

3. The boost bridge amplifier of claim 2, wherein
the second node of said power supply (1) is connected to the first node of the first phase (51) of said load (5),
the first node of said power supply (1) is connected to the first node of said switching bridge (3) and the first node of said bridge capacitor (6), and
the second node of said bridge capacitor (6) is connected to the second node of said switching bridge (3).

4. The boost bridge amplifier of claim 3, wherein all active switches are semiconductor switches, such as mosfets, IGBT, bipolar transistors or MCT.

5. The boost bridge amplifier of claim 2, wherein all active switches are semiconductor switches, such as mosfets, IGBT, bipolar transistors or MCT.

6. The boost bridge amplifier of claim 1, wherein
the first node of said power supply (1) is connected to the first node of the first phase (51) of said load (5) and the first node of the second phase (52) of said load (5),
the second node of said power supply (1) is connected to the second node of said switching bridge (3) and the second node of said bridge capacitor (6),
the first node of said bridge capacitor (6) is connected to the first node of said switching bridge (3),
the second node of the first phase (51) of said load (5) is connected to the third node of said switching bridge (3),
the second node of the second phase (52) of said load (5) is connected to the fourth node of said switching bridge (3),
the first active switch (31) of said switching bridge (3) is connected between the first and third nodes of said switching bridge (3),
the first diode (71) anode is connected to the third node of said switching bridge (3), and the first diode (71) cathode is connected to the first node of said switching bridge (3),
the second active switch (32) of said switching bridge (3) is connected between the third and second nodes of said switching bridge (3),
the second diode (72) anode is connected to the second node of said switching bridge (3), and the second diode (72) cathode is connected to the third node of said switching bridge (3),
the third active switch (33) of said switching bridge (3) is connected between the first and fourth nodes of said switching bridge (3),
the third diode (73) anode is connected to the fourth node of said switching bridge (3), and the third diode (73) cathode is connected to the first node of said switching bridge (3),
the fourth active switch (34) of said switching bridge (3) is connected between the fourth and second nodes of said switching bridge (3), and
the fourth diode (74) anode is connected to the second node of said switching bridge (3), and the fourth diode (74) cathode is connected to the fourth node of said switching bridge (3).

7. The boost bridge amplifier of claim 6, wherein load (5) is a dual voice coil loudspeaker.

8. The boost bridge amplifier of claim 6, wherein
the second node of said power supply (1) is connected to the first node of the first phase (51) of said load (5) and the first node of the second phase (52) of said load (5),
the first node of said power supply (1) is connected to the first node of said switching bridge (3) and the first node of said bridge capacitor (6), and
the second node of said bridge capacitor (6) is connected to the second node of said switching bridge (3).

9. The boost bridge amplifier of claim 8, wherein
the third node of said switching bridge (3) is connected to the first node of the filtering capacitor (91),
the second node of said filtering capacitor (91) is connected to the first node of an additional load (92), and
the second node of said additional load (92) is connected to the fourth node of said switching bridge (3).

10. The boost bridge amplifier of claim 8, wherein load (5) is a dual voice coil loudspeaker.

11. The boost bridge amplifier of claim 8, wherein all active switches are semiconductor switches, such as mosfets, IGBT, bipolar transistors or MCT.

12. The boost bridge amplifier of claim 6, wherein
the third node of said switching bridge (3) is connected to the first node of the filtering capacitor (91),
the second node of said filtering capacitor (91) is connected to the first node of an additional load (92), and
the second node of said additional load (92) is connected to the fourth node of said switching bridge (3).

13. The boost bridge amplifier of claim 6, wherein all active switches are semiconductor switches, such as mosfets, IGBT, bipolar transistors or MCT.

14. The boost bridge amplifier of claim 1, wherein
the first node of said power supply (1) is connected to the first node of the first phase (51) of said load (5), the first node of the second phase (52) of said load (5), and the first node of the third phase (53) of said load (5), the second node of said power supply (1) is connected to the second node of said switching bridge (3) and the second node of said bridge capacitor (6), the first node of said bridge capacitor (6) is connected to the first node of said switching bridge (3), the second node of the first phase (51) of said load (5) is connected to the third node of said switching bridge (3), the second node of the second phase (52) of said load (5) is connected to the fourth node of said switching bridge (3), the second node of the third phase (53) of said load (5) is connected to the fifth node of said switching bridge (3), the first active switch (31) of said switching bridge (3) is connected between the first and third nodes of said switching bridge (3), the first diode (71) anode is connected to the third node of said switching bridge (3), and the first diode (71) cathode is connected to the first node of said switching bridge (3), the second active switch (32) of said switching bridge (3) is connected between the third and second nodes of said switching bridge (3), the second diode (72) anode is connected to the second node of said switching bridge (3), and the second diode (72) cathode is connected to the third node of said switching bridge (3), the third active switch (33) of said switching bridge (3) is connected between the first and fourth nodes of said switching bridge (3), the third diode (73) anode is connected to the fourth node of said switching bridge (3), and the third diode (73) cathode is connected to the first node of said switching bridge (3), the fourth active switch (34) of said switching bridge (3) is connected between the fourth and second nodes of said switching bridge (3), the fourth diode (74) anode is connected to the second node of said switching bridge (3), and the fourth diode (74) cathode is connected to the fourth node of said switching bridge (3), the fifth active switch (35) of said switching bridge (3) is connected between the first and fifth nodes of said switching bridge (3), the fifth diode (75) anode is connected to the fifth node of said switching bridge (3), and the fifth diode (75) cathode is connected to the first node of said switching bridge (3), the sixth active switch (36) of said switching bridge (3) is connected between the fifth and second nodes of said switching bridge (3), and the sixth diode (76) anode is connected to the second node of said switching bridge (3), and the sixth diode (76) cathode is connected to the fifth node of said switching bridge (3).

15. The boost bridge amplifier of claim 14, wherein the second node of said power supply (1) is connected to the first node of the first phase (51) of said load (5), the first node of the second phase (52) of said load (5), and the first node of the third phase (53) of said load (5), the first node of said power supply (1) is connected to the first node of said switching bridge (3) and the first node of said bridge capacitor (6), and the second node of said bridge capacitor (6) is connected to the second node of said switching bridge (3).

16. The boost bridge amplifier of claim 15, wherein load (5) is a three-phase electric motor.

17. The boost bridge amplifier of claim 15, wherein all active switches are semiconductor switches, such as mosfets, IGBT, bipolar transistors or MCT.

18. The boost bridge amplifier of claim 14, wherein load (5) is a three-phase electric motor.

19. The boast bridge amplifier of claim 14, wherein all active switches are semiconductor switches, such as mosfets, IGBT, bipolar transistors or MCT.

20. The boost bridge amplifier of claim 1, wherein load (5) is a dual voice coil loudspeaker.

21. The boost bridge amplifier of claim 1, wherein load (5) is a three-phase electric motor.

22. A boost bridge amplifier comprising:

a power supply (1), having a first and a second nodes, a poly-phase load (5), having a first and a send nodes per each phase, an output filter (4), having a first and a second nodes per each phase, a switching bridge (3), having a first and a second nodes, common for all phases, and an output node per each phase, a bridge capacitor (6), having a first and a second nodes, characterized in that, the first node of said power supply (1) is connected to the first node of each phase of said load (5), the second node of said power supply (1) is connected to the second node of said switching bridge (3) and the second node of said bridge capacitor (6), the first node of said bridge capacitor (6) is connected to the first node of said switching bridge (3), the second node of each phase of said load (5) is connected to the first node of the appropriate phase of said output filter (4), the second node of each phase of said output filter (4) is connected to the output node of the appropriate phase of said switching bridge (3), and the power supply (1) is DC power supply.

23. The boost bridge amplifier of claim 22, wherein the second node of a first phase (51) of said load (5) is connected to the first node of first filtering inductor (41), the second node of first filtering inductor (41) is connected to the third node of said switching bridge (3), the first active switch (31) of said switching bridge (3) is connected between the first and third nodes of said switching bridge (3), the first diode (71) anode is connected to the third node of said switching bridge (3), and the first diode (71) cathode is connected to the first node of said switching bridge (3), the second active switch (32) of said switching bridge (3) is connected between the third and second nodes of said switching bridge (3), and the second diode (72) anode is connected to the second node of said switching bridge (3), and the second diode (72) cathode is connect to the third node of said switching bridge (3).

24. The boost bridge amplifier of claim 23, wherein the first node of the first filtering inductor (41) is connected to the first node of a first filtering capacitor (81), and the second node of said bridge capacitor (6) is connected to the second node of the first filtering capacitor (81).

25. The boost bridge amplifier of claim 24, wherein all active switches are semiconductor switches, such as mosfets, IGBT, bipolar transistors or MCT.

26. The boost bridge amplifier of claim 23, wherein
the second node of said power supply (1) is connected to the first node of the first phase (51) of said load (5),
the first node of said power supply (1) is connected to the first node of said switching bridge (3) and the first node of said bridge capacitor (6), and
the second node of said bridge capacitor (6) is connected to the second node of said switching bridge (3).

27. The boost bridge amplifier of claim 26, wherein
the first node of the first filtering indictor (41) is connected to the first node of the first filtering capacitor (81), and
the first node of said bridge capacitor (6) is connected to the second node of the first filtering capacitor (81).

28. The boost bridge amplifier of claim 27, wherein all active switches are semiconductor switches, such as mosfets, IGBT, bipolar transistors or MCT.

29. The boost bridge amplifier of claim 26, wherein all active switches are semiconductor switches, such as mosfets, IGBT, bipolar transistors or MCT.

30. The boost bridge amplifier of claim 23, wherein all active switches are semiconductor switches, such as mosfets, IGBT, bipolar transistors or MCT.

31. The boost bridge amplifier of claim 22, wherein
the first node of said power supply (1) is connected to the first node of first phase (51) of said load (5) and the first node of the second phase (52) of said load (5),
the second node of said power supply (i) is connected to the second node of said switching bridge (3) and the second node of said bridge capacitor (6),
the first node of said bridge capacitor (6) is connected to the first node of said switching bridge (3),
the second node of first phase (51) of said load (5) is connected to the first node of the first filtering inductor (41),
the second node of the first filtering inductor (41) is connected to the third node of said switching bridge (3),
the second node of the second phase (52) of said load (5) is connected to the first node of the second filtering inductor (42),
the second node of the second filtering inductor (42) is connected to the fourth node of said switching bridge (3),
the first active switch (31) of said switching bridge (3) is connected between the first and third nodes of said switching bridge (3),
the first diode (71) anode is connected to the third node of said switching bridge (3), and the fit diode (71) cathode is connected to the first node of said switching bridge (3),
the second active switch (32) of said switching bridge (3) is connected between the third and second nodes of said switching bridge (3),
the second diode (72) anode is connected to the second node of said switching bridge (3), and the second diode (72) cathode is connected to the third node of said switching bridge (3),
the third active switch (33) of said switching bridge (3) is connected between the first and fourth nodes of said switching bridge (3),
the third diode (73) anode is connected to the fourth node of said switching bridge (3), and the third diode (73) cathode is connected to the first node of said switching bridge (3),
the fourth active switch (34) of said switching bridge (3) is connected between the fourth and second nodes of said switching bridge (3), and
the fourth diode (74) anode is connected to the second node of said switching bridge (3), and the fourth diode (74) cathode is connected to the fourth node of said switching bridge (3).

32. The boost bridge amplifier of claim 31, wherein
the first node of the first filtering inductor (41) is connected to the first node of the first filtering capacitor (81),
the second node of said bridge capacitor (6) is connected to the second node of the first filtering capacitor (81),
the first node of the second filtering inductor (42) is connected to the first node of the second filtering capacitor (82), and
the second node of said bridge capacitor (6) is connected to the second node of the second filtering capacitor (82).

33. The boost bridge amplifier of claim 32, wherein
the third node of said switching bridge (3) is connected to the first node of the filtering capacitor (91),
the second node of said filtering capacitor (91) is connected to the fir node of an additional load (92), and
the second node of said additional load (92) is connected to the fourth node of said switching bridge (3).

34. The boost bridge amplifier of claim 32, wherein load (5) is a dual voice coil loudspeaker.

35. The boost bridge amplifier of claim 32, wherein all active switches are semiconductor switches, such as mosfets, IGBT, bipolar transistors or MCT.

36. The boost bridge amplifier of claim 31, wherein
the second node of said power supply (1) is connected to the first node of the first phase (51) of said load (5) and the first node of the second phase (52) of said load (5),
the first node of said power supply (1) is connected to the first node of said switching bridge (3) and the first node of said bridge capacitor (6), and
the second node of said bridge capacitor (6) is connected to the second node of said switching bridge (3).

37. The boost bridge amplifier of claim 36, wherein
the first node of the first filtering inductor (41) is connected to the first node of the first filtering capacitor (81),
the first node of said bridge capacitor (6) is connected to the second node of the first filtering capacitor (81),
the first node of the second filtering inductor (42) is connected to the first node of the second filtering capacitor (82), and
the first node of said bridge capacitor (6) is connected to the second node of the second filtering capacitor (82).

38. The boost bridge amplifier of claim 37, wherein
the third node of said switching bridge (3) is connected to the first node of the filtering capacitor (91),
the second node of said filtering capacitor (91) is connected to the first node of an additional load (92), and
the second node of said additional load (92) is connected to the fourth node of said switching bridge (3).

39. The boost bridge amplifier of claim 37, wherein load (5) is a dual voice coil loudspeaker.

40. The boost bridge amplifier of claim 37, wherein all active switches are semiconductor switches, such as mosfets, IGBT, bipolar transistors or MCT.

41. The boost bridge amplifier of claim 36, wherein
the third node of said switching bridge (3) is connected to the first node of the filtering capacitor (91), the second node of said filtering capacitor (91) is connected to the first node of an additional load (92), and the second node of said additional load (92) is connected to the fourth node of said switching bridge (3).

42. The boost bridge amplifier of claim 36, wherein load (5) is a dual voice coil loudspeaker.

43. The boost bridge amplifier of claim 36, wherein all active switches are semiconductor switches, such as mosfets, IGBT, bipolar transistors or MCT.

44. The boost bridge amplifier of claim 31, wherein the third node of said switching bridge (3) is connected to the first node of the filtering capacitor (91), the second node of said filtering capacitor (91) is connected to the first node of an additional load (92), and the second node of said additional load (92) is connected to the fourth node of said switching bridge (3).

45. The boost bridge amplifier of claim 31, wherein load (5) is a dual voice coil loudspeaker.

46. The boost bridge amplifier of claim 31, wherein all active switches are semiconductor switches, such as mosfets, IGBT, bipolar transistors or MCT.

47. The boost bridge amplifier of claim 22, wherein the first node of said power supply (1) is connected to the first node of the first phase (51) of said load (5), the first node of the second phase (52) of said load (5), and the first node of the third phase (53) of said load (5), the second node of said power supply (1) is connected to the second node of said switching bridge (3) and the second node of said bridge capacitor (6), the first node of said bridge capacitor (6) is connected to the first node of said switching bridge (3), the second node of the first phase (51) of said load (5) is connected to the first node of the first filtering inductor (41), the second node of the first filtering inductor (41) is connected to the third node of said switching bridge (3), the second node of the second phase (52) of said load (5) is connected to the first node of the second filtering inductor (42), the second node of the second filtering inductor (42) is connected to the fourth node of said switching bridge (3), the second node of the third phase (53) of said load (5) is connected to the first node of the third filtering inductor (43), the second node of the third filtering inductor (43) is connected to the fifth node of said switching bridge (3), the first active switch (31) of said switching bridge (3) is connected between the first and third nodes of said switching bridge (3), the first diode (71) anode is connected to the third node of said switching bridge (3), and the first diode (71) cathode is connected to the first node of said switching bridge (3), the second active switch (32) of said switching bridge (3) is connected between the third and second nodes of said switching bridge (3), the second diode (72) anode is connected to the second node of said switching bridge (3), and the second diode (72) cathode is connected to the third node of said switching bridge (3), the third active switch (33) of said switching bridge (3) is connected between the first and fourth nodes of said switching bridge (3), the third diode (73) anode is connected to the fourth node of said switching bridge (3), and the third diode (73) cathode is connected to the first node of said switching bridge (3), the fourth active switch (34) of said switching bridge (3) is connected between the fourth and second nodes of said switching bridge (3), the fourth diode (74) anode is connected to the second node of said switching bridge (3), and the fourth diode (74) cathode is connected to the fourth node of said switching bridge (3), the fifth active switch (35) of said switching bridge (3) is connected between the first and fifth nodes of said switching bridge (3), the fifth diode (75) anode is connected to the fifth node of said switching bridge (3), and the fifth diode (75) cathode is connected to the first node of said switching bridge (3), the sixth active switch (36) of said switching bridge (3) is connected between the fifth and second nodes of said switching bridge (3), and the sixth diode (76) anode is connected to the second node of said switching bridge (3), and the sixth diode (76) cathode is connected to the fifth node of said switching bridge (3).

48. The boost bridge amplifier of claim 47, wherein the first node of the first filtering inductor (41) is connected to the first node of the first filtering capacitor (81), the second node of said bridge capacitor (6) is connected to the second node of the first filtering capacitor (81), the first node of the second filtering inductor (42) is connected to the first node of the second filtering capacitor (82), the second node of said bridge capacitor (6) is connected to the second node of the second filtering capacitor (82), the first node of the third filtering inductor (43) is connected to the first node of the third filtering capacitor (83), and the second node of said bridge capacitor (6) is connected to the second node of the third filtering capacitor (83).

49. The boost bridge amplifier of claim 48, wherein load (5) is a three-phase electric motor.

50. The boost bridge amplifier of claim 48, wherein all active switches are semiconductor switches, such as mosfets, IGBT, bipolar transistors or MCT.

51. The boost bridge amplifier of claim 47, wherein the second node of said power supply (1) is connected to the first node of the first phase (51) of said load (5), the first node of the second phase (52) of said load (5), and the first node of the third phase (53) of said load (5), the first node of said power supply (1) is connected to the first node of said switching bridge (3) and the first node of said bridge capacitor (6), and the second node of said bridge capacitor (6) is connected to the second node of said switching bridge (3).

52. The boost bridge amplifier of claim 51, wherein the first node of the first filtering inductor (41) is connected to the first node of the first filtering capacitor (81), the first node of said bridge capacitor (6) is connected to the second node of the first filtering capacitor (81), the first node of the second filtering inductor (42) is connected to the first node of the second filtering capacitor (82), the first node of said bridge capacitor (6) is connected to the second node of the second filtering capacitor (82), the first node of the third filtering inductor (43) is connected to the first node of the third filtering capacitor (83), and the first node of said bridge capacitor (6) is connected to the second node of the third filtering capacitor (83).

53. The boost bridge amplifier of claim 52, wherein load (5) is a three-phase electric motor.

54. The boost bridge amplifier of claim 52, wherein all active switches are semiconductor switches, such as mosfets, IGBT, bipolar transistors or MCT.

55. The boost bridge amplifier of claim 51, wherein load (5) is a three-phase electric motor.

56. The boost bridge amplifier of claim 51, wherein all active switches are semiconductor switches, such as mosfets, IGBT, bipolar transistors or MCT.

57. The boost bridge amplifier of claim 47, wherein load (5) is a three-phase electric motor.

58. The boost bridge amplifier of claim 47, wherein all active switches are semiconductor switches, such as mosfets, IGBT, bipolar transistors or MCT.

59. The boost bridge amplifier of claim 22, wherein load (5) is a dual voice coil loudspeaker.

60. The boost bridge amplifier of claim 22, wherein load (5) is a three-phase electric motor.

61. A boost bridge amplifier comprising:

a power supply (1), having a first and a second nodes, a poly-phase load (5), having a first and a second nodes per each phase, a switching bridge (3), having a first and a second nodes, common for all phases, and an output node per each phase, a bridge capacitor (6), having a first and a second nodes, characterized in that, the first node of said power supply (1) is connected to the first node of each phase of said load (5) and the second node of said bridge capacitor (6), the second node of said power supply (1) is connected to the second node of said switching bridge (3), the first node of said bridge capacitor (6) is connected to the first node of said switching bridge (3), the second node of each phase of said load (5) is connected to the output node of the appropriate phase of said switching bridge (3), the load (5) comprises resistance and smoothing inductance connected in series, and the power supply (1) is DC power supply.

62. The boost bridge amplifier of claim 61, wherein the second node of a first phase (51) of said load (5) is connected to the third node of said switching bridge (3), the first active switch (31) of said switching bridge (3) is connected between the first and third nodes of said switching bridge (3), the first diode (71) anode is connected to the third node of said switching bridge (3), and the first diode (71) cathode is connected to the first node of said switching bridge (3), the second active switch (32) of said switching bridge (3) is connected between the third and second nodes of said switching bridge (3), and the second diode (72) anode is connected to the second node of said switching bridge (3), and the second diode (72) cathode is connected to the third node of said switching bridge (3).

63. The boost bridge amplifier of claim 62, wherein the second node of said power supply (1) is connected to the first node of the first phase (51) of said load (5) and the first node of said bridge capacitor (6), the first node of said power supply (1) is connected to the first node of said switching bridge (3), and the second node of said bridge capacitor (6) is connected to the second node of said switching bridge (3).

64. The boost bridge amplifier of claim 63, wherein all active switches are semiconductor switches, such as mosfets, IGBT, bipolar transistors or MCT.

65. The boost bridge amplifier of claim 62, wherein all active switches are semiconductor switches, such as mosfets, IGBT, bipolar transistors or MCT.

66. The boost bridge amplifier of claim 61, wherein the first node of said power supply (1) is connected to the fist node of the first phase (51) of said load (5), the first node of the second phase (52) of said load (5) and the second node of said bridge capacitor (6), the second node of said power supply (1) is connected to the second node of said switching bridge (3), the first node of said bridge capacitor (6) is connected to the first node of said switching bridge (3), the second node of the first phase (51) of said load (5) is connected to the third node of said switching bridge (3), the second node of the second phase (52) of said load (5) is connected to the fourth node of said switching bridge (3), the first active switch (31) of said switching bridge (3) is connected between the first and third nodes of said switching bridge (3), the first diode (71) anode is connected to the third node of said switching bridge (3), and the first diode (71) cathode is connected to the first node of said switching bridge (3), the second active switch (32) of said switching bridge (3) is connected between the third and second nodes of said switching bridge (3), the second diode (72) anode is connected to the second node of said switching bridge (3), and the second diode (72) cathode is connected to the third node of said switching bridge (3), the third active switch (33) of said switching bridge (3) is connected between the first and fourth nodes of said switching bridge (3), the third diode (73) anode is connected to the fourth node of said switching bridge (3), and the third diode (73) cathode is connected to the first node of said switching bridge (3), the fourth active switch (34) of said switching bridge (3) is connected between the fourth and second nodes of said switching bridge (3), and the fourth diode (74) anode is connected to the second node of said switching bridge (3), and the fourth diode (74) cathode is connected to the fourth node of said switching bridge (3).

67. The boost bridge amplifier of claim 66, wherein the second node of said power supply (1) is connected to the first node of the first phase (51) of said load (5), the first node of the second phase (52) of said load (5) and the first node of said bridge capacitor (6), the first node of said power supply (1) is connected to the first node of said switching bridge (3), and the second node of said bridge capacitor (6) is connected to the second node of said switching bridge (3).

68. The boost bridge amplifier of claim 67, wherein the third node of said switching bridge (3) is connected to the first node of the filtering capacitor (91), the second node of said filtering capacitor (91) is connected to the first node of an additional load (92), and
the second node of said additional load (92) is connected to the fourth node of said switching bridge (3).

69. The boost bridge amplifier of claim 67, wherein load (5) is a dual voice coil loudspeaker.

70. The boost bridge amplifier of claim 67, wherein all active switches are semiconductor switches, such as mosfets, IGBT, bipolar transistors or MCT.

71. The boost bridge amplifier of claim 66, wherein
the third node of said switching bridge (3) is connected to the first node of the filtering capacitor (91),
the second node of said filtering capacitor (91) is connected to the first node of an additional load (92), and
the second node of said additional load (92) is connected to the fourth node of said switching bridge (3).

72. The boost bridge amplifier of claim 66, wherein load (5) is a dual voice coil loudspeaker.

73. The boost bridge amplifier of claim 66, wherein all active switches are semiconductor switches, such as mosfets, IGBT, bipolar transistors or MCT.

74. The boost bridge amplifier of claim 61, wherein
the first node of said power supply (1) is connected to the first node of the first phase (51) of said load (5), the first node of the second phase (52) of said load (5), the first node of the third phase (53) of said load (5), and the second node of said bridge capacitor (6),
the second node of said power supply (1) is connected to the second node of said switching bridge (3),
the first node of said bridge capacitor (6) is connected to the first node of said switching bridge (3),
the second node of the first phase (51) of said load (5) is connected to the third node of said switching bridge (3),
the second node of the second phase (52) of said load (5) is connected to the fourth node of said switching bridge (3),
the second node of the third phase (53) of said load (5) is connected to the fifth node of said switching bridge (3),
the first active switch (31) of said switching bridge (3) is connected between the first and third nodes of said switching bridge (3),
the first diode (71) anode is connected to the third node of said switching bridge (3), and the first diode (71) cathode is connected to the first node of said switching bridge (3),
the second active switch (32) of said switching bridge (3) is connected between the third and second nodes of said switching bridge (3),
the second diode (72) anode is connected to the second node of said switching bridge (3), and the second diode (72) cathode is connected to the third node of said switching bridge (3),
the third active switch (33) of said switching bridge (3) is connected between the first and fourth nodes of said switching bridge (3),
the third diode (73) anode is connected to the fourth node of said switching bridge (3), and the third diode (73) cathode is connected to the first node of said switching bridge (3),
the fourth active switch (34) of said switching bridge (3) is connected between the fourth and second nodes of said switching bridge (3),
the fourth diode (74) anode is connected to the second node of said switching bridge (3), and the fourth diode (74) cathode is connected to the fourth node of said switching bridge (3),
the fifth active switch (35) of said switching bridge (3) is connected between the first and fifth nodes of said switching bridge (3),
the fifth diode (75) anode is connected to the fifth node of said switching bridge (3), and the fifth diode (75) cathode is connected to the first node of said switching bridge (3),
the sixth active switch (36) of said switching bridge (3) is connected between the fifth and second nodes of said switching bridge (3), and
the sixth diode (76) anode is connected to the second node of said switching bridge (3), and the sixth diode (76) cathode is connected to the fifth node of said switching bridge (3).

75. The boost bridge amplifier of claim 74, wherein
the second node of the said power supply (1) is connected to the first node of the first phase (51) of said load (5), the first node of the second phase (52) of said load (5), the first node of the third phase (53) of said load (5) and the first node of said bridge capacitor (6),
the first node of the said power supply (1) is connected to the first node of said switching bridge (3), and
the second node of said bridge capacitor (6) is connected to the second node of said switching bridge (3).

76. The boost bridge amplifier of claim 75, wherein load (5) is a three-phase electric motor.

77. The boost bridge amplifier of claim 75, wherein all active switches are semiconductor switches, such as mosfets, IGBT, bipolar transistors or MCT.

78. The boost bridge amplifier of claim 74, wherein load (5) is a three-phase electric motor.

79. The boost bridge amplifier of claim 74, wherein all active switches are semiconductor switches, such as mosfets, IGBT, bipolar transistors or MCT.

80. The boost bridge amplifier of claim 61, wherein load (5) is a dual voice coil loudspeaker.

81. The boost bridge amplifier of claim 61, wherein load (5) is a three-phase electric motor.

* * * * *